(12) United States Patent
Hashimoto et al.

(10) Patent No.: US 10,881,011 B2
(45) Date of Patent: Dec. 29, 2020

(54) INTERCONNECTION DEVICE AND DEVICE SYSTEM

(71) Applicant: PANASONIC INTELLECTUAL PROPERTY MANAGEMENT CO., LTD., Osaka (JP)

(72) Inventors: Noboru Hashimoto, Mie (JP); Yukihiro Matsunobu, Ibaraki (JP); Shinichiro Yano, Osaka (JP); Jumpei Kitagawa, Mie (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/431,241

(22) Filed: Jun. 4, 2019

(65) Prior Publication Data

US 2019/0380216 A1 Dec. 12, 2019

(30) Foreign Application Priority Data

Jun. 6, 2018 (JP) .................................. 2018-108995
Nov. 12, 2018 (JP) .................................. 2018-212532

(51) Int. Cl.
*H05K 7/02* (2006.01)
*H05K 7/04* (2006.01)
(Continued)

(52) U.S. Cl.
CPC ............. *H05K 5/0204* (2013.01); *H02G 3/26* (2013.01); *H02G 3/30* (2013.01); *H04L 12/10* (2013.01); *H05K 5/0247* (2013.01)

(58) Field of Classification Search
USPC ........................................ 361/809, 810, 807
See application file for complete search history.

(56) References Cited

U.S. PATENT DOCUMENTS

| 4,909,758 A * | 3/1990 | Woods ................... H01R 31/06 |
| | | 439/535 |
| 2007/0091925 A1* | 4/2007 | Miyazaki ................. H04B 3/58 |
| | | 370/469 |

FOREIGN PATENT DOCUMENTS

| EP | 0 586 075 A1 | 3/1994 |
| JP | 2007-174699 A | 7/2007 |

(Continued)

OTHER PUBLICATIONS

Extended European Search Report dated Aug. 5, 2019 issued for the corresponding European Patent Application No. 19 178 042.8.
(Continued)

*Primary Examiner* — Hung S. Bui
(74) *Attorney, Agent, or Firm* — McDermott Will & Emery LLP

(57) ABSTRACT

The interconnection device includes a housing, and a first communication unit and an output unit which are accommodated in the housing. The housing includes a duct connector physically attachable and electrically connectable to a wiring duct for transferring first power. The first communication unit performs communication in a power line communication scheme through the wiring duct. The output unit includes a second communication unit and a conversion unit. The second communication unit communicates with a device in a telecommunication standard different from the power line communication scheme in accordance with the communication signal received by the first communication unit. The conversion unit generates second power of a different standard from the first power based on the first power obtained from the wiring duct through the duct connector and supply the second power to the device.

19 Claims, 20 Drawing Sheets

(51) Int. Cl.
*H05K 5/02* (2006.01)
*H02G 3/00* (2006.01)
*H02G 3/30* (2006.01)
*H04L 12/10* (2006.01)

(56) References Cited

FOREIGN PATENT DOCUMENTS

| JP | 2009-100294 | * | 7/2008 | ............... | H04B 3/54 |
| JP | 2009-094945 | A | 4/2009 | | |
| JP | 2008-167283 | * | 5/2009 | ............... | H04B 3/54 |
| JP | 2009-224822 | A | 10/2009 | | |
| JP | 2009-232429 | * | 10/2009 | ............... | H04B 3/54 |

OTHER PUBLICATIONS

First Office Action dated Aug. 20, 2020 issued for the corresponding Chinese Patent Application No. 201910485303.X; with English translation.

* cited by examiner

INTERCONNECTION DEVICE AND DEVICE SYSTEM

CROSS-REFERENCE TO RELATED APPLICATION

The present application is based upon and claims the benefit of priorities of Japanese Patent Application No. 2018-108995, filed on Jun. 6, 2018 and No. 2018-212532, filed on Nov. 12, 2018, the entire contents of which are incorporated herein by reference.

TECHNICAL FIELD

The present disclosure generally relates to interconnection devices and device systems. The present disclosure particularly relates to an interconnection device for interconnecting a wiring duct and a device, and a device system including the interconnection device.

BACKGROUND ART

JP 2009-224822 A discloses a loudspeaker installation system (device system). The loudspeaker installation system of JP 2009-224822 A includes a lighting duct (wiring duct) fixed to a ceiling of a residence or a store, lighting devices removably connected to the lighting duct, and loudspeaker (speaker) systems removably connected to the lighting duct. Each loudspeaker system is electrically connected to the lighting duct by connecting a duct holder thereof to the lighting duct. Each electrically connected loudspeaker system receives power fed to the lighting duct through a lighting use power supply connector, as power supply power, by connected part of the duct holder, through the lighting duct. Additionally, JP 2009-224822 A discloses inputting audio signals into the loudspeaker systems through the lighting duct by power line communication PLC).

According to contents of JP 2009-224822 A, only a device with a duct holder corresponding to the lighting duct (wiring duct) can be communicated and fed via the wiring duct. Therefore, communication and power supply using the wiring duct cannot apply to devices different in power standards from the wiring duct.

SUMMARY

An object would be to propose an interconnection device and a device system which enable communication and power supply to a device by use of a wiring duct even if the device uses a different power standard from the wiring duct.

One aspect according to the present disclosure is an interconnection device including: a housing, a first communication unit, and an output unit. The housing includes a duct connector physically attachable and electrically connectable to a wiring duct for transferring first power. The first communication unit is accommodated in the housing. The first communication unit is connectable to the wiring duct through the duct connector and is configured to perform communication in a power line communication scheme through the wiring duct. The output unit is accommodated in the housing. The output unit includes a second communication unit and a conversion unit. The second communication unit is configured to communicate with a device in a telecommunication standard different from the power line communication scheme. The conversion unit is configured to generate second power of a different standard from the first power based on the first power obtained from the wiring duct through the duct connector and supply the second power to the device.

One aspect according to the present disclosure is a device system including the interconnection device, the wiring duct, and the device.

BRIEF DESCRIPTION OF THE DRAWINGS

The figures depict one or more implementation in accordance with the present teaching, by way of example only, not by way of limitations. In the figures, like reference numerals refer to the same or similar elements.

DETAILED DESCRIPTION

1. Embodiments 1.1 Overview

Figure 1:
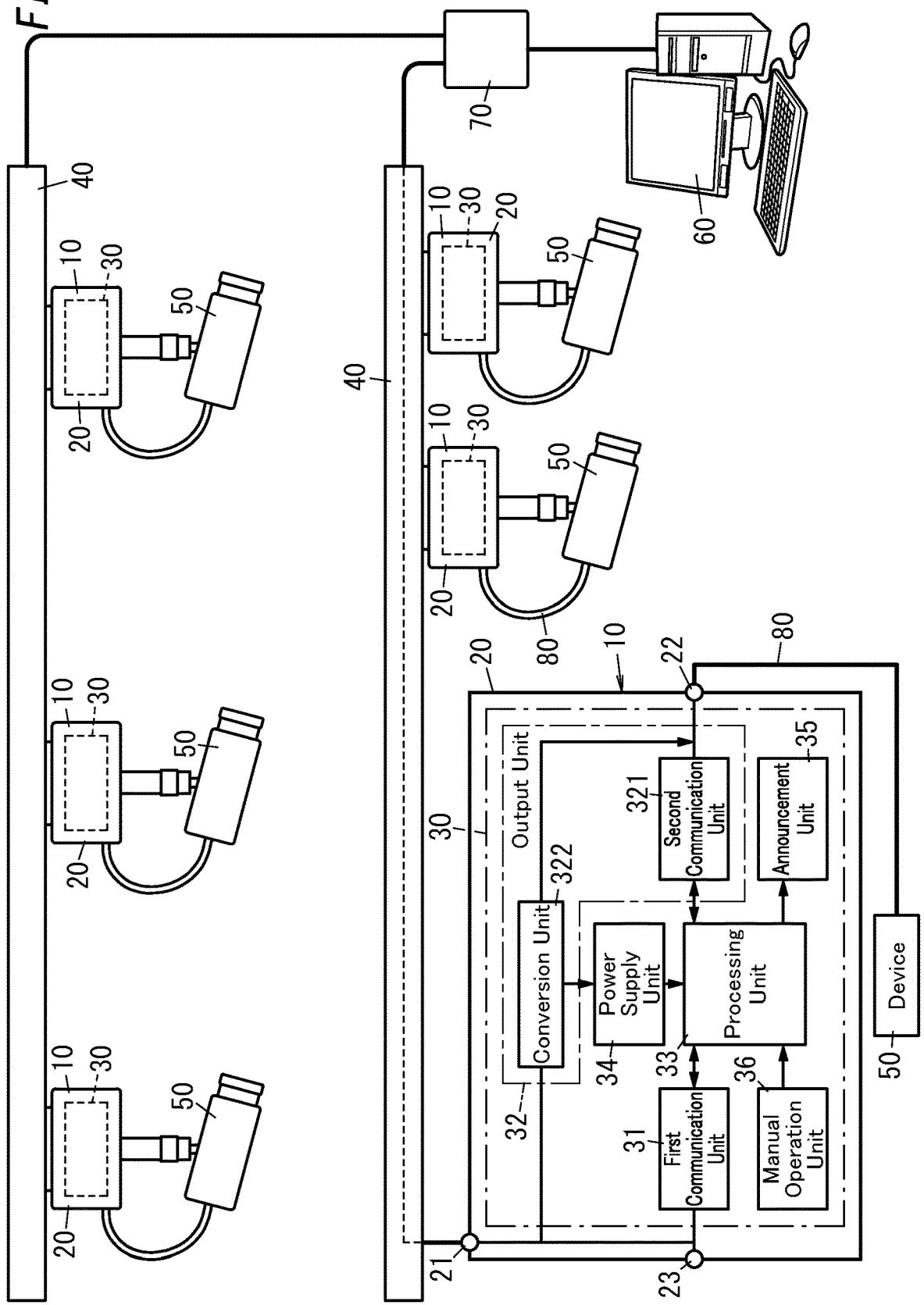
FIG. 1 is a diagram for illustration of a device system including an interconnection device of an embodiment.

FIG. 1 is an illustration of a device system according to the present embodiment. The device system may be used in facilities (e.g., factories), for example. The device system includes an interconnection device 10 configured to connect a device 50 to a wiring duct 40 installed in the facilities. The interconnection device 10 includes a housing 20 and further includes a first communication unit 31 and an output unit 32 which are accommodated in the housing 20. The housing 20 includes a duct connector 21 physically attachable and electrically connectable to the wiring duct 40 for transferring first power. The first communication unit 31 is connectable to the wiring duct 40 through the duct connector 21 and is configured to perform communication in a power line communication scheme through the wiring duct 40. The output unit 32 includes a second communication unit 321 and a conversion unit 322. The second communication unit 321 is configured to communicate with a device 50 in a telecommunication standard different from the power line communication scheme. The conversion unit 322 is configured to generate second power of a different standard from the first power based on the first power obtained from the wiring duct 40 through the duct connector 21 and supply the second power to the device 50.

The interconnection device 10 can be attached to the wiring duct 40 by use of the duct connector 21.

Further, the output unit 32 of the interconnection device 10 enables communication using a different telecommunication standard from the power line communication scheme through the wiring duct 40, and further enables power supply in accordance with a different power standard from the wiring duct 40. Therefore, the interconnection device 10 enables communication and power supply to the device 50 by use of the wiring duct 40 even if the device 50 uses a different power standard from the wiring duct 40.

1.2 Configurations

Hereinafter, the device system is described in detail with reference to attached figures. FIG. 1 shows the device system including an interconnection device 10, a wiring duct 40, and a device 50. The present embodiment refers to the device system including a plurality of interconnection devices 10, a plurality of wiring ducts 40, and a plurality of devices 50. Further, the device system includes a management device 60 and an adaptor 70.

Figure 4:
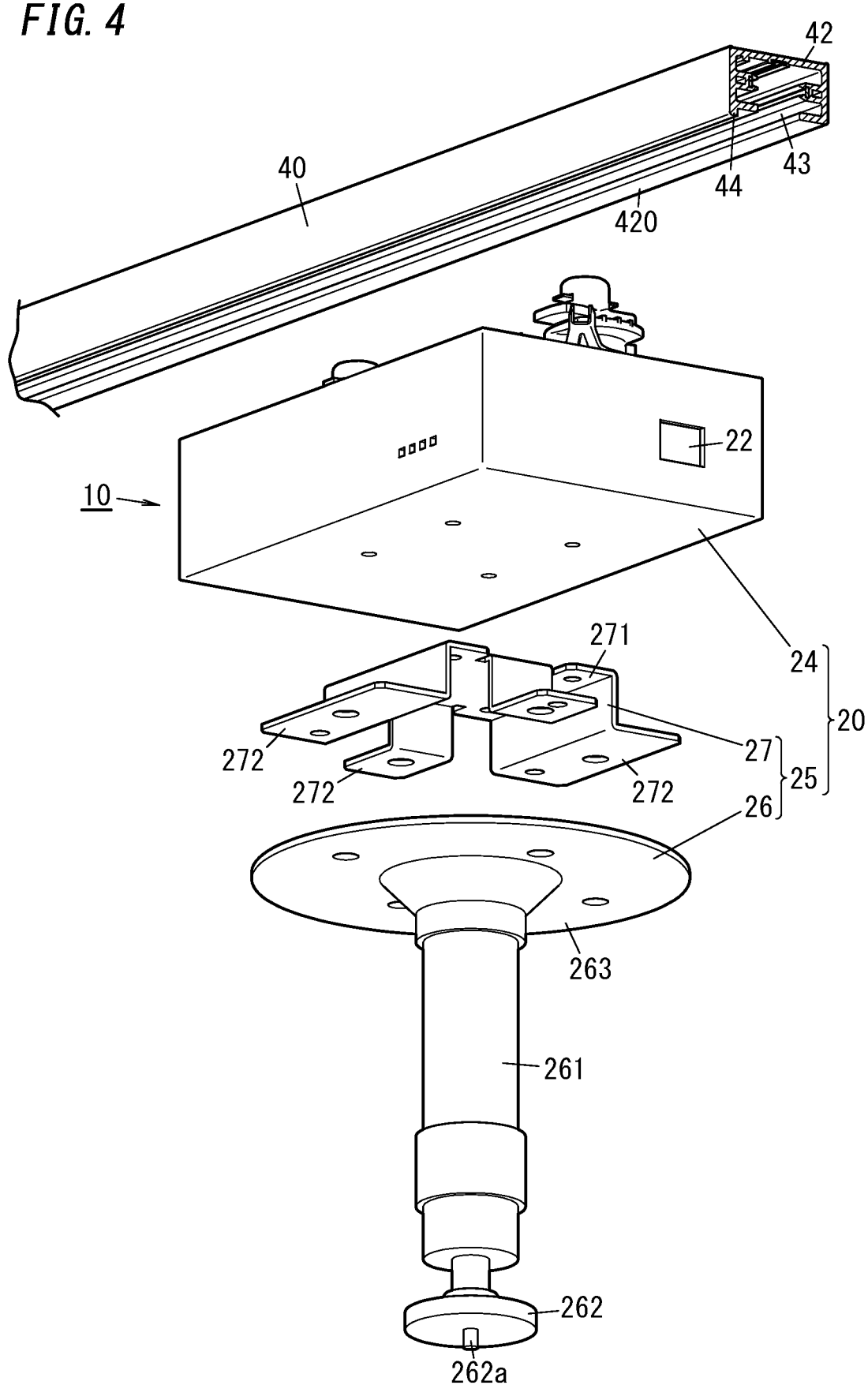
FIG. 4 is another perspective view of the above interconnection device.
Figure 5:
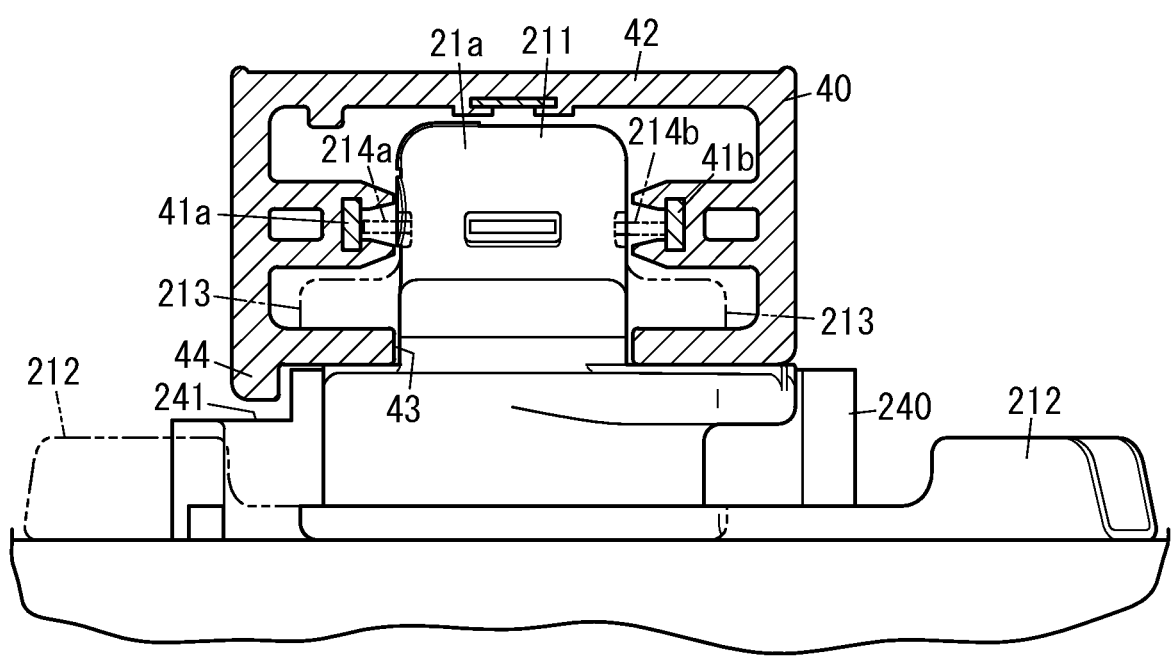
FIG. 5 is a diagram for illustration of how to connect the above interconnection device to a wiring duct.

The wiring duct 40 is installed in facilities in advance for the purpose of transfer of power (first power). In the present embodiment, the first power may mean AC power (e.g., commercial AC power of 60 or 50 Hz and 100 or 200 V). As shown in FIG. 5, the wiring duct 40 includes first and second conductors 41a and 41b and a case 42 accommodating the first and second conductors 41a and 41b. The case 42 is in an elongated hollow cuboidal shape. The case 42 has electrically insulating properties. The case 42 may be made of electrically insulating material (e.g., resin material), or formed by coating a surface of a metal body with electrically insulating material, for example. The case 42 has a surface 420 in a thickness direction (lower surface in FIG. 4) provided with an opening 43 and a protrusion 44. The opening 43 is located at the center of the surface 420 of the case 42 and extends in a length direction of the case 42. The protrusion 44 is located at one end (left end in FIG. 5) of the surface 420 of the case 42, and extends in the length direction of the case 42. The protrusion 44 is provided for prevention of misconnection of the interconnection device 10 to the wiring duct 40. The first and second conductors 41a and 41b are accommodated in the case 42 to face each other in a width direction of the case 42 (left and right direction in FIG. 5). Further, the first and second conductors 41a and 41b each extend in the length direction of the case 42. The wiring duct 40 is installed on a ceiling of facilities, for example.

The device 50 is a device used in facilities for achieving various purposes such as control and management. The device 50 includes at least a connector to be connected to the interconnection device 10 by use of the connection cable 80. In the present embodiment, the connection cable 80 is a cable in accordance with standards for computer networks. Particularly, the connection cable 80 conforms to Ethernet (registered trademark) standards and also conforms to power over ethernet (PoE) standards. Therefore, the connector of the device 50 is a port in conformity with the Ethernet standards. The device 50 can operate with power supplied through the connection cable 80. Accordingly, the device 50 operates with power (second power) of a different standard (power standard) from the first power transferred through the wiring duct 40. The second power is power in conformity with the PoE standard, and is DC power of 48 V, in one example. Examples of the device 50 may include monitoring devices, alarming devices, controlling devices, and communicating devices. Examples of the monitoring devices may include cameras (network cameras) and sensors (human sensors and fire sensors). Examples of the alarming devices may include loudspeakers, projectors, and displays (digital signages). Examples of the controlling devices may include lighting devices and air conditioning devices. Examples of the communicating devices may include access points.

The management device 60 is a device for management and control of the device 50. The management device 60 is connected to the wiring duct 40 by way of the adaptor 70. The adaptor 70 is a device for enabling power line communication. The device system enables various functions by using the management device 60. For example, when the device 50 includes a camera, the management device 60 enables confirmation of a picture taken by the device 50. Or, when the device 50 is a digital signage, the management device 60 enables the device 50 to display information. The management device 60 can be implemented by a personal computer (e.g., a desktop computer and a laptop computer), for example. Note that, the management device 60 may be implemented by a mobile information terminal such as a smartphone, a tablet, for example.

Next, the interconnection device 10 is described. The interconnection device 10 is a device for connecting the device 50 to the wiring duct 40. In other words, the interconnection device 10 functions as a plug for connection of the device 50 to the wiring duct 40.

Figure 2:
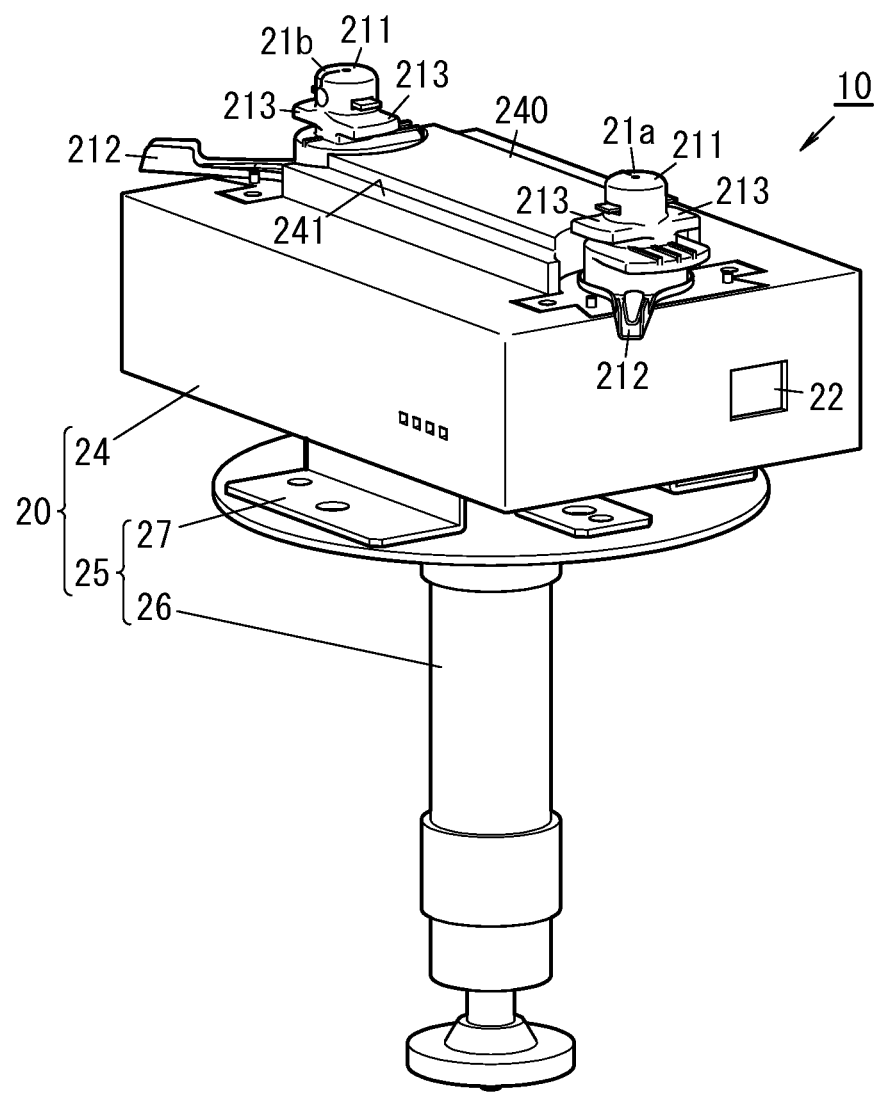
FIG. 2 is a perspective view of the above interconnection device.

FIG. 1 is a block diagram of the interconnection device 10 and FIG. 2 is a perspective view of the interconnection device 10. As shown in FIG. 1 and FIG. 2, the interconnection device 10 includes a housing 20 and a circuit block 30 accommodated in the housing 20.

Figure 3:
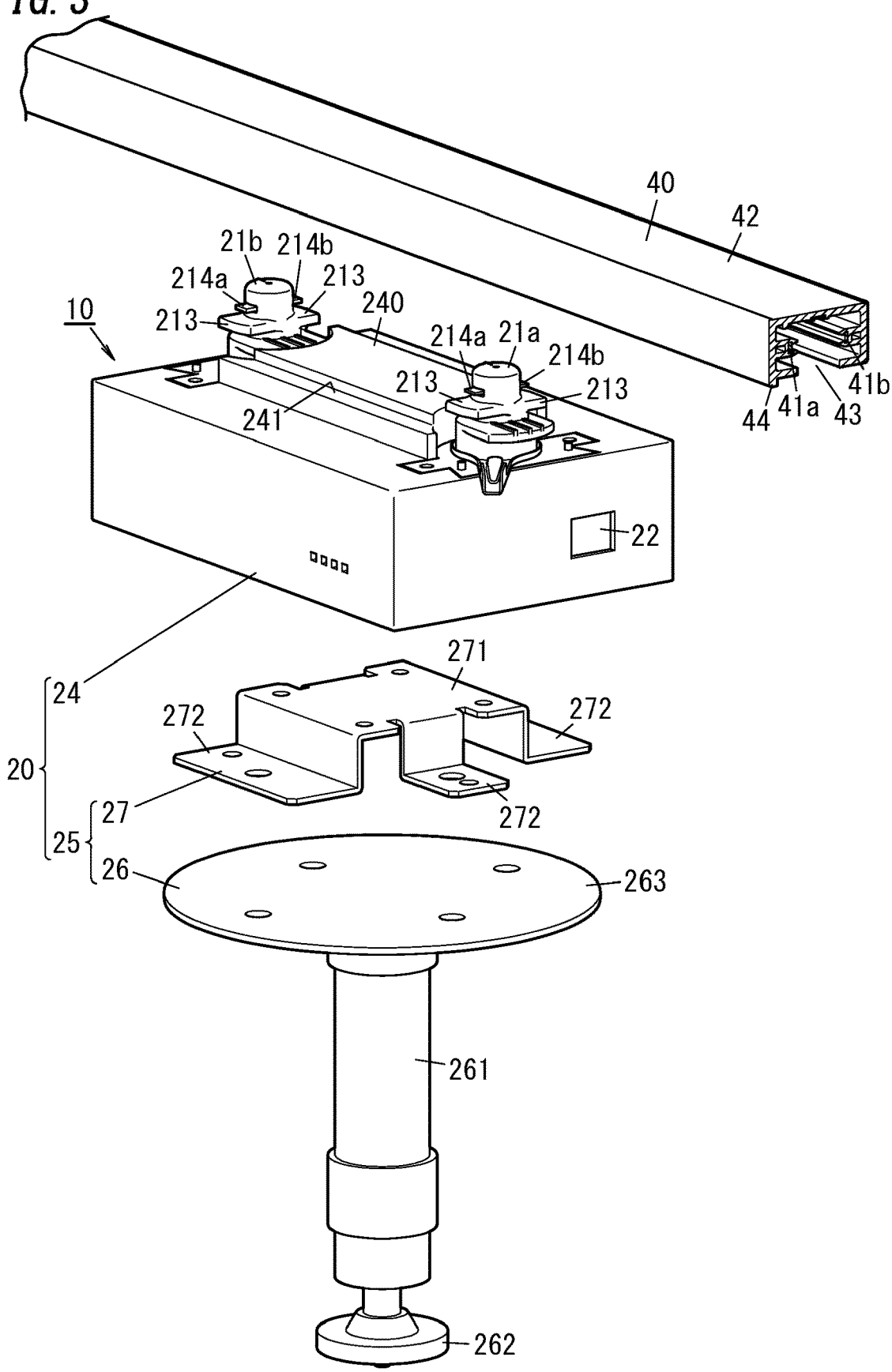
FIG. 3 is an exploded perspective view of the above interconnection device.

As shown in FIG. 1, the housing 20 includes a duct connector 21, a device connector 22, and an auxiliary power supply unit 23. Further, as shown in FIG. 2 to FIG. 4, the housing 20 includes an accommodation unit 24 and a holding unit 25.

The accommodation unit 24 is formed into a box and is configured to accommodate the circuit block 30. As shown in FIG. 2 to FIG. 4, the accommodation unit 24 has a cuboidal box shape. The accommodation unit 24 has a length, a width, and a thickness.

Additionally, the accommodation unit 24 is provided with the duct connector 21, the device connector 22, and the auxiliary power supply unit 23.

The duct connector 21 is used to connect the interconnection device 10 to the wiring duct 40. The duct connector 21 is provided to a first surface in a thickness direction (an upper surface in FIG. 2) of the accommodation unit 24. The duct connector 21 includes first and second couplers 21a and 21b. The first and second couplers 21a and 21b are located on opposite ends of the first surface in the thickness direction of the accommodation unit 24. Particularly, in the present embodiment, the first and second couplers 21a and 21b are located on the first surface in the thickness direction of the accommodation unit 24 to be positioned at opposite ends in a length direction of the accommodation unit 24 but at a center in a width direction of the accommodation unit 24.

The first and second couplers 21a and 21b each include a protruding part 211, a lever 212, and a pair of protrusions 213 and 213. The protruding part 211 protrudes from the first surface in the thickness direction of the accommodation unit 24. The protruding part 211 has a solid cylindrical shape and is rotatable around its central axis. Further, the protruding part 211 itself has a size to be allowed to pass through the opening 43 of the case 42. The lever 212 is a member for rotating the protruding part 211 around the central axis thereof. The lever 212 protrudes from the protruding part 211 in a direction across the central axis of the protruding part 211. The pair of protrusions 213 and 213 protrude from the protruding part 211 to opposite sides thereof. The pair of protrusions 213 and 213 each have a width smaller than a diameter of the protruding part 211.

Further, the first coupler 21a includes first and second terminals 214a and 214b. The first and second terminals 214a and 214b are electrically connected to the first and second conductors 41a and 41b of the wiring duct 40, respectively. In the present embodiment, the first and second terminals 214a and 214b are associated with the first and second conductors 41a and 41b of the wiring duct 40, respectively. Therefore, connecting the first and second terminals 214a and 214b to the first and second conductors 41a and 41b respectively results in proper connection. However, connecting the first and second terminals 214a and 214b to the second and first conductors 41b and 41a respectively results in improper connection. Similarly to the pair of protrusions 213 and 213, the first and second terminals 214a and 214b protrude from the protruding part 211 to opposite sides thereof. The first and second terminals 214a and 214b are located closer to the top end of the protruding part 211 than the pair of protrusions 213 and 213 are, and cover the pair of protrusions 213 and 213 when viewed in a direction along the central axis of the protruding part 211.

The first and second couplers 21a and 21b can be rotated between a first position (first rotation position) and a second position (second rotation position) by manually operating the lever 212. The first position is a position where the pair of protrusions 213 and 213 are arranged in the length direction of the accommodation unit 24. The second position is a position where the pair of protrusions 213 and 213 are arranged in the width direction of the accommodation unit 24. For example, FIG. 2 shows the first coupler 21a is in the second position and the second coupler 21b is in the first position. Alternatively, FIG. 3 shows the first and second couplers 21a and 21b both are in the second position. Further, in FIG. 5, the first coupler 21a in the first position is drawn by solid lines and the first coupler 21a in the second position is drawn by dashed-two dotted lines. Hence, the first and second couplers 21a and 21b can pass through the opening 43 when being in the first position, but cannot pass through the opening 43 when being in the second position.

The device connector 22 is a part to be connected to the device 50. In the present embodiment, the device connector 22 is connected to the device 50 through the connection cable 80. In one example, the device connector 22 may be a port in conformity with the Ethernet standard. Especially, the device connector 22 conforms to the power over ethernet (PoE) standard, too. In the present embodiment, as shown 2, the device connector 22 is provided to a side surface of the accommodation unit 24 (in particular, one side surface in the length direction of the accommodation unit 24).

The auxiliary power supply unit 23 is a part for providing the first power which is carried through the wiring duct 40. The auxiliary power supply unit 23 is a connector including one or more terminals for power supply. In one example, the auxiliary power supply unit 23 may be an outlet used in supply of commercial AC power (e.g., an outlet for attachment plugs). In the present embodiment, the auxiliary power supply unit 23 is provided to a side surface of the accommodation unit 24 (in particular, a side surface opposite from the side surface provided with the device connector 22).

Further, the accommodation unit 24 includes a rib 240 at the first surface in the thickness direction of the accommodation unit 24 (the upper surface in FIG. 2). When the interconnection device 10 (especially, the accommodation unit 24) is in a proper position relative to the wiring duct 40, the rib 240 is not in contact with a top end (lower end in FIG. 5) of the protrusion 44 of the wiring duct 40. In contrast, when the interconnection device 10 (especially, the accommodation unit 24) is in an improper position relative to the wiring duct 40, the rib 240 is in contact with the top end (lower end in FIG. 5) of the protrusion 44 of the wiring duct 40. While the rib 240 is in contact with the protrusion 44, the rib 240 and the protrusion 44 prevent the first and second couplers 21a and 21b from being inserted into the opening 43 of the wiring duct 40 even when being in the first position. In the present embodiment, the rib 240 has a cuboidal shape, and includes a step 241 for preventing the rib 240 from being in contact with the protrusion 44 when the accommodation unit 24 is in the proper position relative to the wiring duct 40. The proper position of the interconnection device 10 relative to the wiring duct 40 is a position where the first and second terminals 214a and 214b are connected to the first and second conductors 41a and 41b respectively. The improper position of the interconnection device 10 relative to the wiring duct 40 is a position where the improper connection in which the first and second terminals 214a and 214b are connected to the second and first conductors 41b and 41a respectively occurs.

The interconnection device 10 including the aforementioned duct connector 21 is attached to the wiring duct 40 as follows. First, the first and second couplers 21a and 21b are made to be in the first position by using the lever 212, if necessary. The first and second couplers 21a and 21b are inserted into the case 42 through the opening 43 of the wiring duct 40 while being kept in this state. In this case, when the interconnection device 10 is in the improper position relative to the wiring duct 40, the rib 240 comes into contact with the top end of the protrusion 44 and therefore the first and second couplers 21a and 21b are prevented from being inserted into the case 42 of the wiring duct 40. Therefore, the improper connection can be prevented from occurring. Accordingly, it may be possible to reduce probability that the interconnection device 10 is attached to the wiring duct 40 in a wrong way. In contrast, when the interconnection device 10 is in the proper position relative to the wiring duct 40, the rib 240 does not come into contact with the top end of the protrusion 44. Therefore the first and second couplers 21a and 21b are not prevented from being inserted into the case 42 of the wiring duct 40. Thus, it is possible to insert the first and second couplers 21a and 21b into the case 42 of the wiring duct 40.

After the first and second couplers 21a and 21b are inserted into the case 42 through the opening 43 of the wiring duct 40, the first and second couplers 21a and 21b is moved from the first position to the second position by manually operating the lever 212. By doing so, as shown by the two-dashed dotted lines in FIG. 5, regarding each of the first and second couplers 21a and 21b, the pair of protrusions 213 and 213 are physically supported by opposite ends of the opening 43 of the case 42 of the wiring duct 40. Additionally, regarding the first coupler 21a, the first and second terminals 214a and 214b are electrically connected to the first and second conductors 41a and 41b of the wiring duct 40, respectively. Accordingly, the duct connector 21 is physically attached and electrically connected to the wiring duct 40. Especially, in the present embodiment, the duct connector 21 is physically attached to the wiring duct 40 at two parts thereof (the first and second couplers 21a and 21b). Consequently, the interconnection device 10 can be attached to the wiring duct 40 more strongly, and thus the device 50 can be attached even if it is heavier.

The holding unit 25 is a part for physically holding the device 50. In the present embodiment, the holding unit 25 is a separate unit from the accommodation unit 24 and thus physically attached to the accommodation unit 24.

As shown in FIG. 2 to FIG. 4, the holding unit 25 includes a first holder 26 and a second holder 27. The first holder 26 and the second holder 27 are made of strong materials such as metal materials.

As shown in FIG. 3 and FIG. 4, the first holder 26 includes a rod 261, a first attachment unit 262, and a second attachment unit 263. The rod 261 has a solid cylindrical shape. The first attachment unit 262 is a part serving as a pedestal where the device 50 is fixed. The first attachment unit 262 is provided at a first end (lower end in FIG. 4) of the rod 261. The first attachment unit 262 has a disk shape, and includes at a center thereof a fixing part 262a which is a screw used for fixing the device 50. The second attachment unit 263 is a part for attachment of the first holder 26 to the accommodation unit 24. The second attachment unit 263 is provided at a second end (upper end in FIG. 4) of the rod 261. The second attachment unit 263 has a plate shape (circular plate shape in the present embodiment).

The second holder 27 includes a base 271 and a plurality of (four, in the figure) arms 272. The base 271 is a part for fixing the second holder 27 to the accommodation unit 24. The base 271 has a plate shape (in the present embodiment, a rectangular plate shape). The base 271 is attached to the accommodation unit 24 by screwing or the like. Each arm 272 protrudes from a side of the base 271 toward the first holder 26. The arm 272 is fixed to the first holder 26 at its top end.

Regarding the holding unit 25, the second holder 27 is attached to the accommodation unit 24 by fixing the base 271 to a second surface in the thickness direction (lower surface in FIG. 4) of the accommodation unit 24 by screwing or the like. In this regard, the second holder 27 is located at a center of the second surface in the thickness direction of the accommodation unit 24. Further, the first holder 26 is attached to the second holder 27 by fixing the second attachment unit 263 to the plurality of arms 272 of the second holder 27 by screwing or the like. By doing so, as shown in FIG. 2, the holding unit 25 (the first holder 26 and the second holder 27) is attached to the accommodation unit 24. According to the holding unit 25, the device 50 can be fixed to the holding unit 25 by use of the fixing part 262a.

As shown in FIG. 1, the circuit block 30 includes a first communication unit 31, an output unit 32, a processing unit 33, a power supply unit 34, an announcement unit 35, and a manual operation unit 36.

The first communication unit 31 includes a communication interface in conformity with power line communication and has functions to send and receive communication signals by power line communication. Note that, power line communication can apply various conventional standards. For example, to use high definition power line communication is preferable. The aforementioned communication interface in conformity with power line communication can be realized by use of a conventional configuration and therefore detail description thereof is omitted.

The first communication unit 31 is electrically connected to the duct connector 21. In detail, the first communication unit 31 is electrically connected to the first and second terminals 214a and 214b of the first coupler 21a of the duct connector 21. Therefore, when the duct connector 21 is attached to the wiring duct 40, the first communication unit 31 is electrically connected to the wiring duct 40 through the duct connector 21. Thus, the first communication unit 31 has a function (receiving function) of receiving a communication signal (first communication signal) based on power line communication from the wiring duct 40 through the duct connector 21. In addition, the first communication unit 31 has a function (sending function) of sending a communication signal (second communication signal) based on power line communication to the wiring duct 40 through the duct connector 21. To sum up, the first communication unit 31 enables bidirectional communication.

As shown in FIG. 1, the output unit 32 is electric circuitry including a second communication unit 321 and a conversion unit 322.

The second communication unit 321 is a circuit for establishing communication with the device 50 in a telecommunication standard (communication protocol) different from the power line communication, in response to the first communication signal received by the first communication unit 31. The second communication unit 321 establishes communication in a telecommunication standard (communication protocol) different from the power line communication. Examples of signals in conformity with a communication protocol different from the power line communication may include signals in conformity with the ethernet (registered trademark) standard and serial signals. In the present embodiment, the second communication unit 321 has a function (sending function) of sending and a function (receiving function) of receiving signals conforming to the ethernet (registered trademark) standard. As shown in FIG. 1, the second communication unit 321 is connected to the device connector 22. Therefore, the second communication unit 321 outputs though the device connector 22 or receives though the device connector 22, signals of the communication protocol different from the power line communication. As described above, the second communication unit 321 communicates with the device 50 through the connection cable 80 connected to the device connector 22.

The conversion unit 322 is a circuit for generating second power of a different standard from the first power based on the first power obtained from the wiring duct 40 through the duct connector 21 and supply the second power to the device 50. As described above, the first power is AC power (e.g., commercial AC power of 60/50 Hz and 100/200 V). The second power is power in conformity with the PoE standard and may be DC power of 48 V for example. Accordingly, the conversion unit 322 may be constituted by a power conversion circuit including one or more ACDC converters. As shown in FIG. 1, the conversion unit 322 is connected to the device connector 22. Therefore, the conversion unit 322 outputs the second power of the different standard from the first power to the device connector 22. Thus, the conversion unit 322 supplies the second power to the device 50 through the connection cable 80 connected to the device connector 22.

In the present embodiment, the output unit 32 conforms to the power over ethernet standard, and thus functions as so-called power sourcing equipment. Note that, the power supply method may be a method of supplying currents by use of two pairs of wires of the connection cable 80 which are used for communication (Alternative A), or a method of supplying currents by use of two pairs of wires of the connection cable 80 which are not in use (Alternative B2). Thus, the output unit 32 uses the device connector 22 for communication with the device 50 and supply of power to the device 50. Therefore, connection for communication and power supply between the interconnection device 10 and the device 50 can be made easily.

The processing unit 33 is a control circuit for controlling operation of the interconnection device 10. The processing unit 33 may be realized by a computer system including one or more processors (microprocessors) and one or more memories, for example. Therefore, the one or more processors execute one or more programs stored in the one or more memories to function as the processing unit 33. In the present embodiment, the processing unit 33 is configured to use the second communication unit 321 to convert a first communication signal received from the wiring duct 40 through the duct connector 21 into a signal of a different telecommunication standard (communication protocol) from the power line communication and output it. Further, the processing unit 33 is configured to use the first communication unit 31 to convert a signal received by the second communication unit 321 from the device 50 through the connection cable 80 into a communication signal (second communication signal) in conformity with the power line communication and output it. In summary, the processing unit 33 may have a function of just relaying signals between the first communication unit 31 and the second communication unit 321. Additionally, the processing unit 33 may have a function of controlling the device 50 in accordance with a first communication signal received by the first communication unit 31. Furthermore, the processing unit 33 may have a function of collecting information from the device 50 by use of the second communication unit 321 and sending it to the management device 60 from the first communication unit 31 through the wiring duct 40.

The power supply unit 34 is a circuit for supplying operation power to the processing unit 33. In the present embodiment, the power supply unit 34 generates power necessary for the processing unit 33 to operate, by use of output (second power) of the conversion unit 322 of the output unit 32. The power supply unit 34 may be a power supply circuit including one or more DCDC converters. Such a power supply circuit may be realized by conventional configurations, and therefore detail description is not given.

The announcement unit 35 may include one or more display devices. Examples of the display devices may include lamps such as light emitting diodes. Note that, the announcement unit 35 may include electro-acoustic transducers such as loudspeakers and buzzers, in addition to or as alternative to the displays. In summary, announcement given by the announcement unit 35 may not be limited to visual announcement but may be audio announcement. For example, the processing unit 33 may announce a state of the interconnection device 10 (information on whether the interconnection device 10 operates normally or is stopped due to malfunction) via the announcement unit 35. Or, the processing unit 33 makes the announcement unit 35 provide announcement corresponding to the first communication signal received by the first communication unit 31.

The manual operation unit 36 is a circuit for change or initialization of setting of the interconnection device 10. The manual operation unit 36 may include one or more switches, for example. Examples of switches may include conventional switches such as dip switches, slide switches, push switches. Examples of the change of setting of the interconnection device 10 may include switch between masters and slaves.

1.3 Conclusion

In the device system described above, the device 50 is connected to the wiring duct 40 by the interconnection device 10. The interconnection device 10 is physically attached to and electrically connected to the wiring duct 40. The interconnection device 10 performs power line communication via the wiring duct 40 by use of the first communication unit 31. Additionally, the interconnection device 10 includes the output unit 32 and thus communicates with the device 50 in the different telecommunication standard from the power line communication, by use of the second communication unit 321 of the output unit 32. Further, the interconnection device 10 uses the conversion unit 322 of the output unit 32 to generate the second power of the different standard from the first power based on the first power obtained from the wiring duct 40 through the duct connector 21 and supply the second power to the device 50. Therefore, the interconnection device 10 enables communication and power supply to the device 50 by use of the wiring duct 40 even if the device 50 uses a different power standard from the wiring duct 40.

Further, the interconnection device 10 allows its position on the wiring duct 40 to be easily changed. Therefore, in installation of the device system, it is not always necessary to decide the position of the device 50 precisely from the start. Thus, installation of the device system can be facilitated. Especially, in the present embodiment, the interconnection device 10 includes the holding unit 25 for holding the device 50. Therefore, the position of the device 50 can be changed by changing the position of the interconnection device 10 on the wiring duct 40. Thus, it is possible to easily change the position of the device 50. Further, the holding unit 25 is a separate unit from the accommodation unit 24 and is physically attached to the accommodation unit 24. Accordingly, attaching the device 50 to the interconnection device 10 may include detaching the holding unit 25 from the accommodation unit 24, attaching the device 50 to the holding unit 25, and subsequently attaching the holding unit 25 to the accommodation unit 24. By doing so, in attaching the device 50 to the interconnection device 10, there is no need to detach the interconnection device 10 itself from the wiring duct 40. Hence, it is possible to facilitate attachment of the device 50 to the interconnection device 10.

2. Variations

Embodiments of the present disclosure are not limited to the above embodiment. The above embodiment may be modified in various ways in accordance with design or the like as it can achieve the object of the present disclosure. Hereinafter, variations of the above embodiment are listed.

2.1 First Variation

Figure 6:
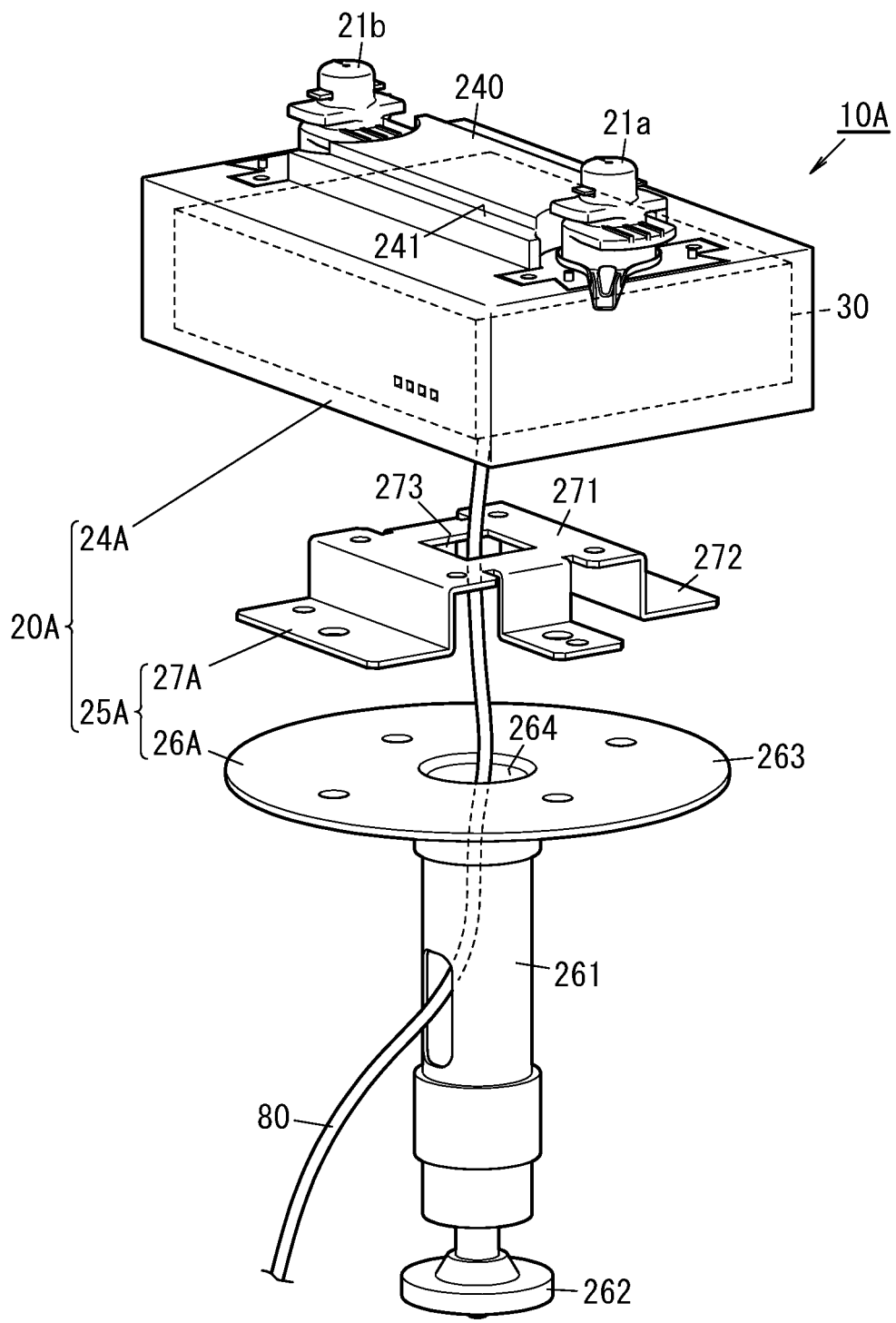
FIG. 6 is a perspective view of an interconnection device of a first variation.
Figure 7:
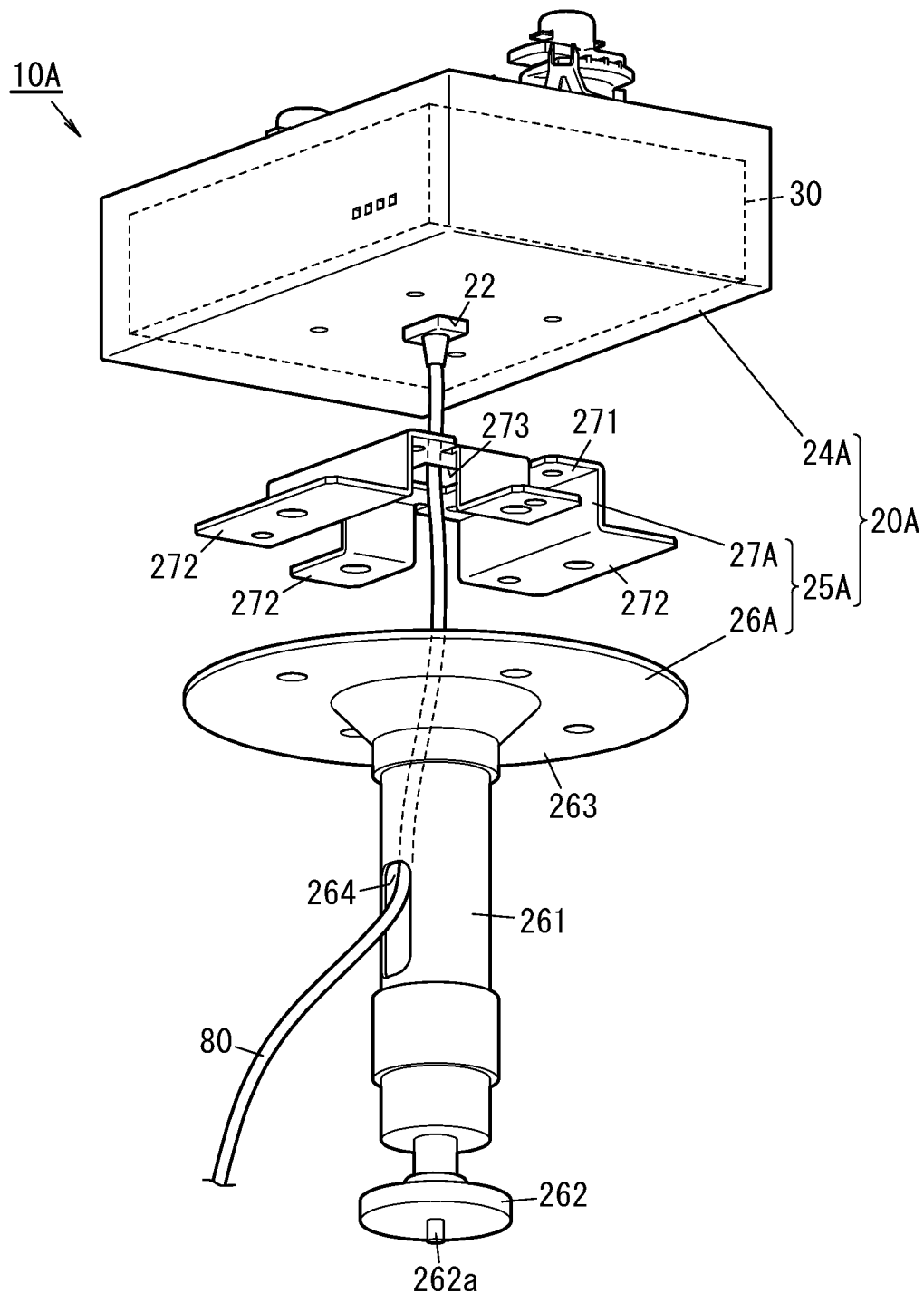
FIG. 7 is another perspective view of an interconnection device of the first variation.

FIG. 6 and FIG. 7 show an interconnection device 10A of a first variation. The interconnection device 10A includes a housing 20A different from the housing 20 of the interconnection device 10. The housing 20A includes an accommodation unit 24A and a holding unit 25A respectively different from the accommodation unit 24 and the holding unit 25 of the housing 20.

The accommodation unit 24A is different from the accommodation unit 24 in a location of the device connector 22. As shown in FIG. 7, the device connector 22 is provided to the second surface in the thickness direction (lower surface in FIG. 7) of the accommodation unit 24A. In particular, the device connector 22 is located at a center of the second surface in the thickness direction of the accommodation unit 24A. Also in the accommodation unit 24A, the holding unit 25A is fixed to the center of the second surface in the thickness direction of the accommodation unit 24A. Accordingly, the holding unit 25A and the device connector 22 are located on the same side of the housing 20A.

The holding unit 25A is a separate unit from the accommodation unit 24A and is physically attached to the accommodation unit 24A. As shown in FIG. 6 and FIG. 7, the holding unit 25A includes a first holder 26A and a second holder 27A. The first holder 26A and the second holder 27A are made of strong material such as metal material. Similarly to the first holder 26, the first holder 26A includes the rod 261, the first attachment unit 262, and the second attachment unit 263. Further, the first holder 26A includes a guide hole 264 allowing the connection cable 80 to pass therethrough. As shown in FIG. 6, the guide hole 264 is a hole interconnecting the center of the second attachment unit 263 and the side surface of the rod 261. Similarly to the second holder 27, the second holder 27A includes the base 271 and the plurality of (4 in the figures) arms 272. Further, the second holder 27A includes an opening 273 allowing the connection cable 80 to pass therethrough. As shown in FIG. 7, the opening 273 is located at the center of the base 271 and exposes the device connector 22. Therefore, it is possible to connect the connection cable 80 to the device connector 22 by way of the opening 273.

In the interconnection device 10A, the holding unit 25A and the device connector 22 are located on the same side of the housing 20A. Therefore, in contrast to the interconnection device 10, a distance between the device connector 22 and the device 50 can be shortened. Accordingly, it is possible to facilitate connection between the device connector 22 and the device 50 through the connection cable 80. Further, in the first variation, the connection cable 80 can be connected to the device connector 22 by way of the guide hole 264 of the holding unit 25A. As a result, the connection cable 80 can be protected by the holding unit 25A. Consequently, it is possible to reduce probability that the connection cable 80 is pulled by an object unintentionally and then broken. Additionally, there may be advantageous effects that the connection cable 80 can be made less perceptible.

2.2 Second Variation

Figure 8:
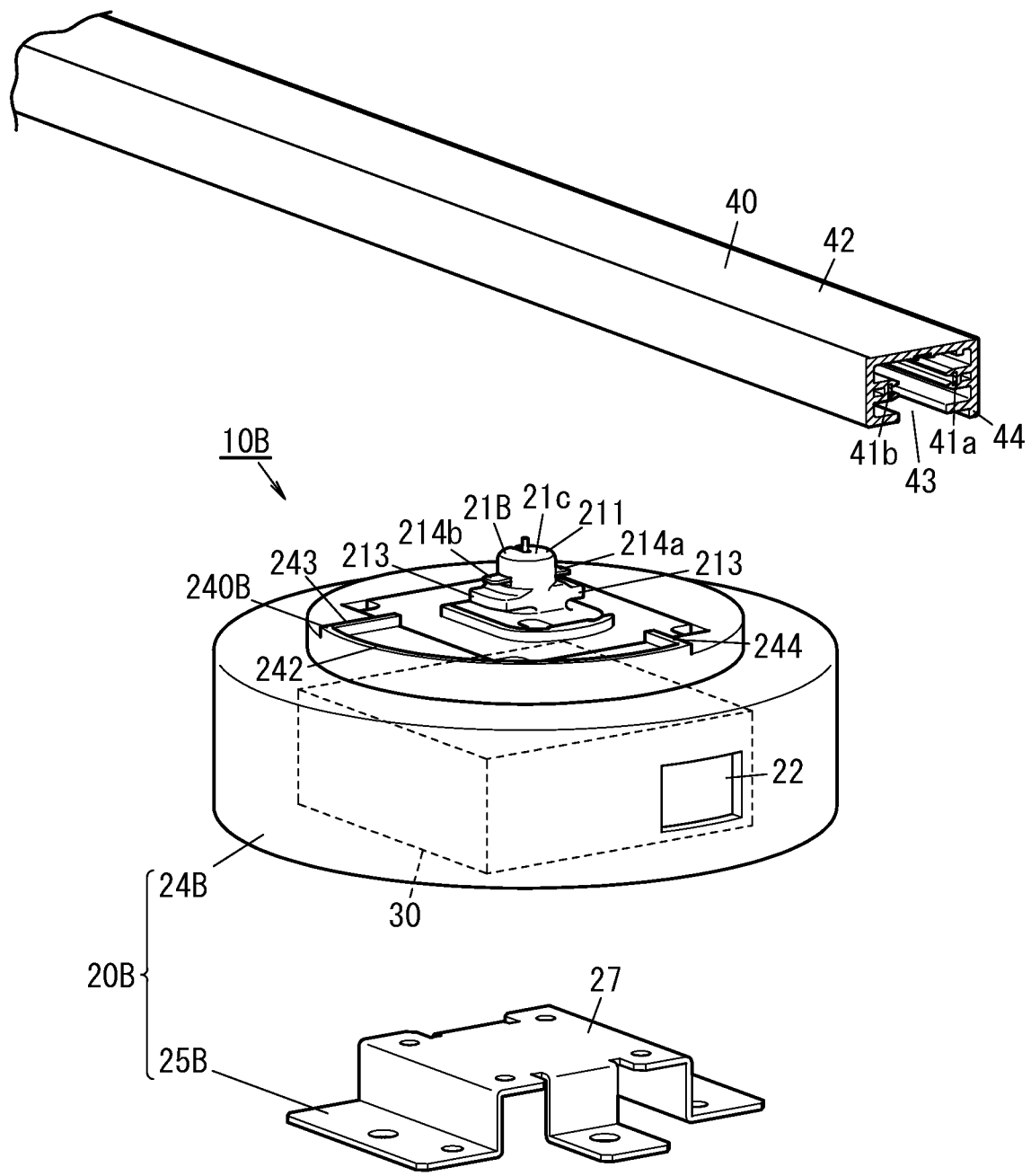
FIG. 8 is a perspective view of an interconnection device of a second variation.
Figure 9:
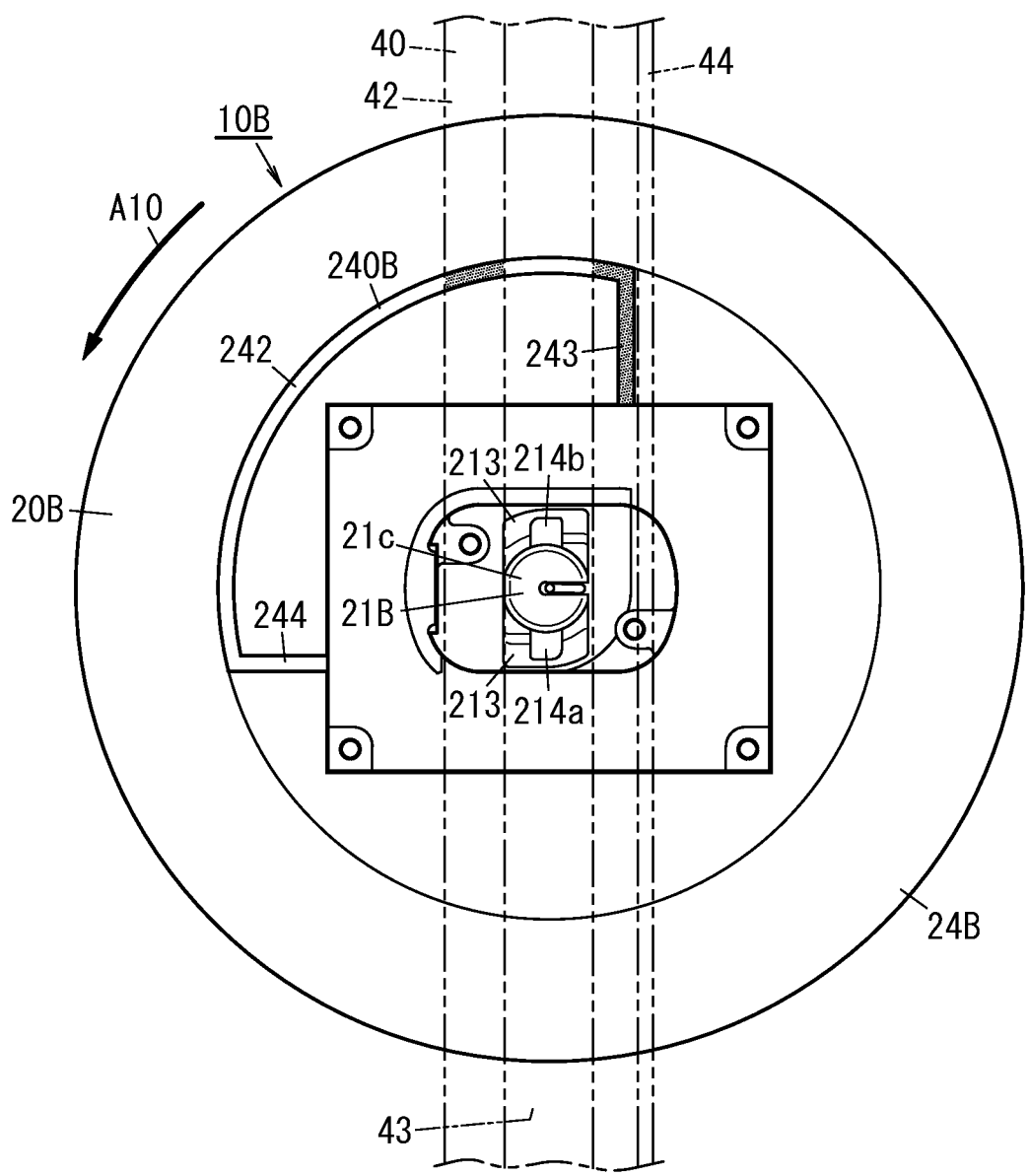
FIG. 9 is a diagram for illustration of how to connect the interconnection device of the second variation to a wiring duct.
Figure 10:
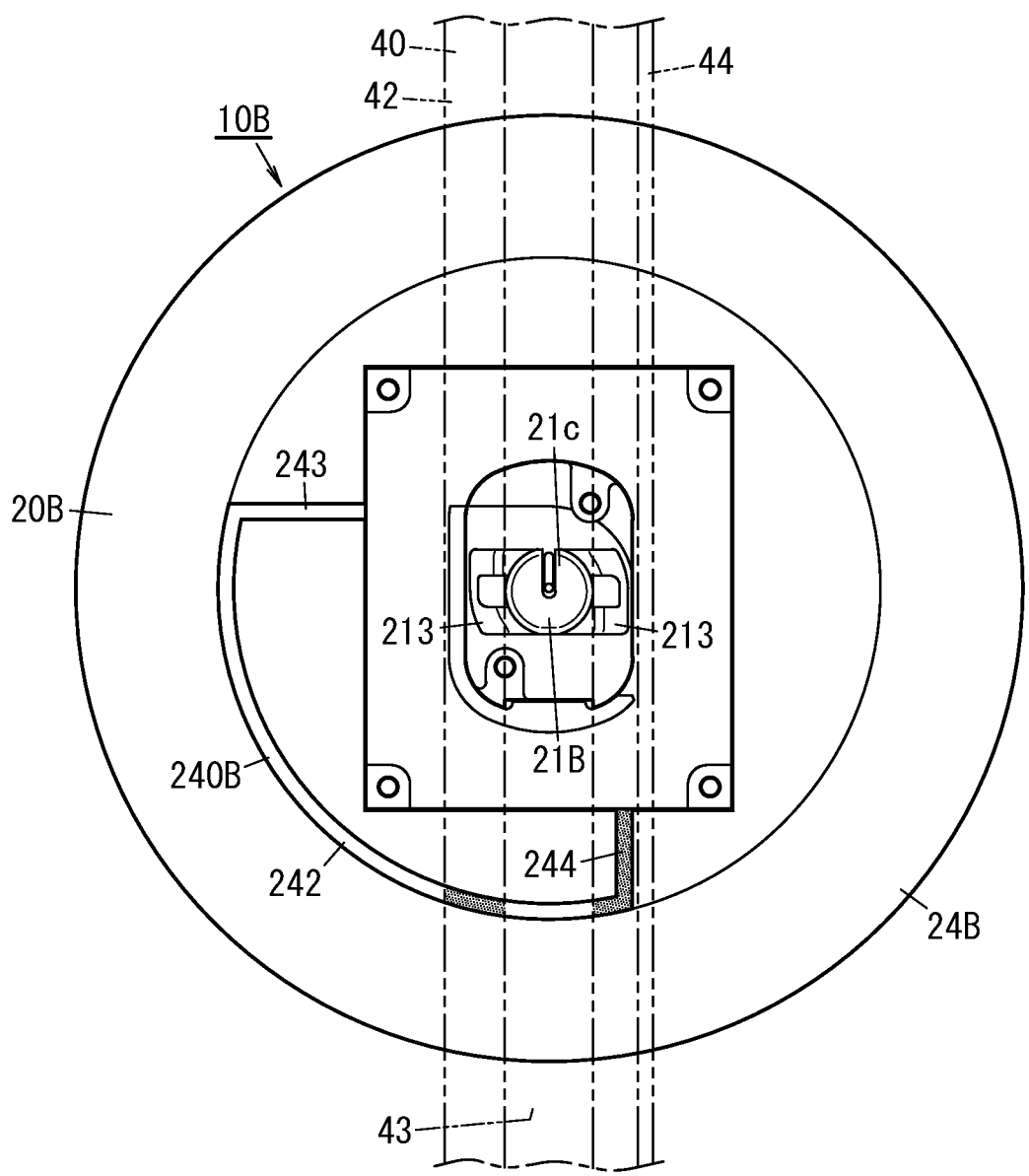
FIG. 10 is a diagram for illustration of how to connect the interconnection device of the second variation to a wiring duct.

FIG. 8 to FIG. 10 show an interconnection device 10B of a second variation. As shown in FIG. 8, the interconnection device 10B includes a housing 20B and the circuit block 30 accommodated in the housing 20B.

The housing 20B includes an accommodation unit 24B and a holding unit 25B. Note that, the holding unit 25B is different from the holding unit 25 in that the holding unit 25B includes the second holder 27 only.

The accommodation unit 24B is formed into a box and is configured to accommodate the circuit block 30. The accommodation unit 24B has a cylindrical box shape. Further, the accommodation unit 24B has a hollow cylindrical part protruding from a center of the first surface in the thickness direction (upper surface in FIG. 8) of the accommodation unit 24B. Further, the accommodation unit 24B is provided with a duct connector 21B, the device connector 22, and the auxiliary power supply unit 23. The device connector 22 and the auxiliary power supply unit 23 are provided to a side surface of the accommodation unit 24B. Note that, in FIG. 8, since the auxiliary power supply unit 23 is on an opposite side from the device connector 22, the auxiliary power supply unit 23 is out of sight.

As shown in FIG. 9 and FIG. 10, the duct connector 21B is used for attachment of the interconnection device 10B to the wiring duct 40. The duct connector 21B is provided to the first surface in the thickness direction (upper surface in FIG. 8) of the accommodation unit 24B. The duct connector 21B includes one coupler 21c. The coupler 21c is located at a center of the first surface in the thickness direction of the accommodation unit 24B.

Similarly to the first coupler 21a, the coupler 21c includes the protruding part 211, the pair of protrusions 213 and 213, and the first and second terminals 214a and 214b. Differently from the first coupler 21a, the coupler 21c does not include the lever 212 and the protruding part 211 is not configured to be rotatable.

Additionally, the accommodation unit 24B includes a rib 240B. The rib 240B is provided to the first surface in the thickness direction of the accommodation unit 24B. When the interconnection device 10B (especially, the accommodation unit 24B) is in a proper position relative to the wiring duct 40, the rib 240B is not in contact with the top end of the protrusion 44 of the wiring duct 40. In contrast, when the interconnection device 10B (especially, the accommodation unit 24B) is in an improper position relative to the wiring duct 40, the rib 240B is in contact with the top end of the protrusion 44 of the wiring duct 40. While the rib 240B is in contact with the protrusion 44, the rib 240B and the protrusion 44 prevent the coupler 21c from being inserted into the opening 43 of the wiring duct 40. As shown in FIG. 9 and FIG. 10, the rib 240B includes a guide 242 and first and second positioning parts 243 and 244. The guide 242 is closer to the outside of the accommodation unit 24B than the coupler 21c is, when viewed in a direction along the central axis of the coupler 21c. The guide 242 has an arc shape which is centered on the central axis of the coupler 21c. In a mere example, the guide 242 has a central angle ranging from about 90 to 120 degrees. The first positioning part 243 protrudes from a first end of the guide 242 toward the coupler 21c. The first positioning part 243 is a straight protrusion extending in a direction in which the pair of protrusions 213 and 213 of the coupler 21c are arranged. The second positioning part 244 protrudes from a second end of the guide 242 toward the coupler 21c. The second positioning part 244 is a straight protrusion extending in a direction perpendicular to the direction in which the pair of protrusions 213 and 213 of the coupler 21c are arranged.

The interconnection device 10B is attached to the wiring duct 40 as follows. First, as shown in FIG. 9, the accommodation unit 24B is positioned relative to the wiring duct 40 so that the direction in which the pair of protrusions 213 and 213 of the coupler 21c are arranged extends along the length direction of the wiring duct 40. The coupler 21c is inserted into the case 42 through the opening 43 of the wiring duct 40 while being kept in this state. In this case, when the interconnection device 10B is in the improper position relative to the wiring duct 40, the rib 240B comes into contact with the top end of the protrusion 44. In one example, when the accommodation unit 24B is in a position rotated around its central axis from the position shown in FIG. 9 by 180 degrees, the rib 240B comes into contact with the top end of the protrusion 44. In this example, the coupler 21c is prevented from being inserted into the case 42 of the wiring duct 40. Therefore, the improper connection can be prevented from occurring. Accordingly, it may be possible to reduce probability that the interconnection device 10B is attached to the wiring duct 40 in a wrong way. In contrast, when the interconnection device 10B is in the proper position relative to the wiring duct 40 (the position shown in FIG. 9), the rib 240B does not come into contact with the top end of the protrusion 44. Therefore the coupler 21c is not prevented from being inserted into the case 42 of the wiring duct 40. Thus, it is possible to insert the coupler 21c into the case 42 of the wiring duct 40.

After the coupler 21c is inserted into the case 42 through the opening 43 of the wiring duct 40, the accommodation unit 24B is rotated around its central axis so that the direction in which the pair of protrusions 213 and 213 of the coupler 21c are arranged is perpendicular to the length direction of the wiring duct 40. In particular, referring to FIG. 9, the accommodation unit 24B is rotated in a direction indicated by an arrow A10. By doing so, as shown in FIG. 10, regarding the coupler 21c, the pair of protrusions 213 and 213 are physically supported by opposite ends of the opening 43 of the case 42 of the wiring duct 40. Additionally, the first and second terminals 214a and 214b are electrically connected to the first and second conductors 41a and 41b of the wiring duct 40, respectively. Accordingly, the duct connector 21B is physically attached and electrically connected to the wiring duct 40.

Note that, if a person tries to rotate the accommodation unit 24B in an opposite direction to the direction indicated by the arrow A10 from the position shown in FIG. 9, the rib 240B (in particular, the first positioning part 243) is going to come into contact with a side surface (left side surface in FIG. 9) of the protrusion 44, and therefore reverse rotation of the accommodation unit 24B can be prevented. Further, when the accommodation unit 24B is in the position shown in FIG. 10, the rib 240B (in particular, the second positioning part 244) is in contact with the side surface (left side surface in FIG. 9) of the protrusion 44. Thus, over rotation of the accommodation unit 24B can be prevented. Therefore, attachment of the interconnection device 10B to the wiring duct 40 can be facilitated.

Additionally, in the proper connection where the first and second terminals 214a and 214b are connected to the first and second conductors 41a and 41b respectively, the rib 240B is not contact with the top end of the protrusion 44 but is in contact with the case 42. In FIG. 9 and FIG. 10, the rib 240B is in direct contact with the case 42. In more detail, the rib 240B is in contact with the surface 420 (see FIG. 4) of the case 42 at its top flat surface. Therefore, the accommodation unit 24B can be rotated while the accommodation unit 24B is made to be in contact with the case 42. Thus, rotation of the accommodation unit 24B relative to the case 42 can be facilitated. In summary, the rib 240B can be used as a guide for attachment of the interconnection device 10B to the wiring duct 40, and this can facilitate attachment of the interconnection device 10B to the wiring duct 40.

2.3 Third Variation

Figure 11:
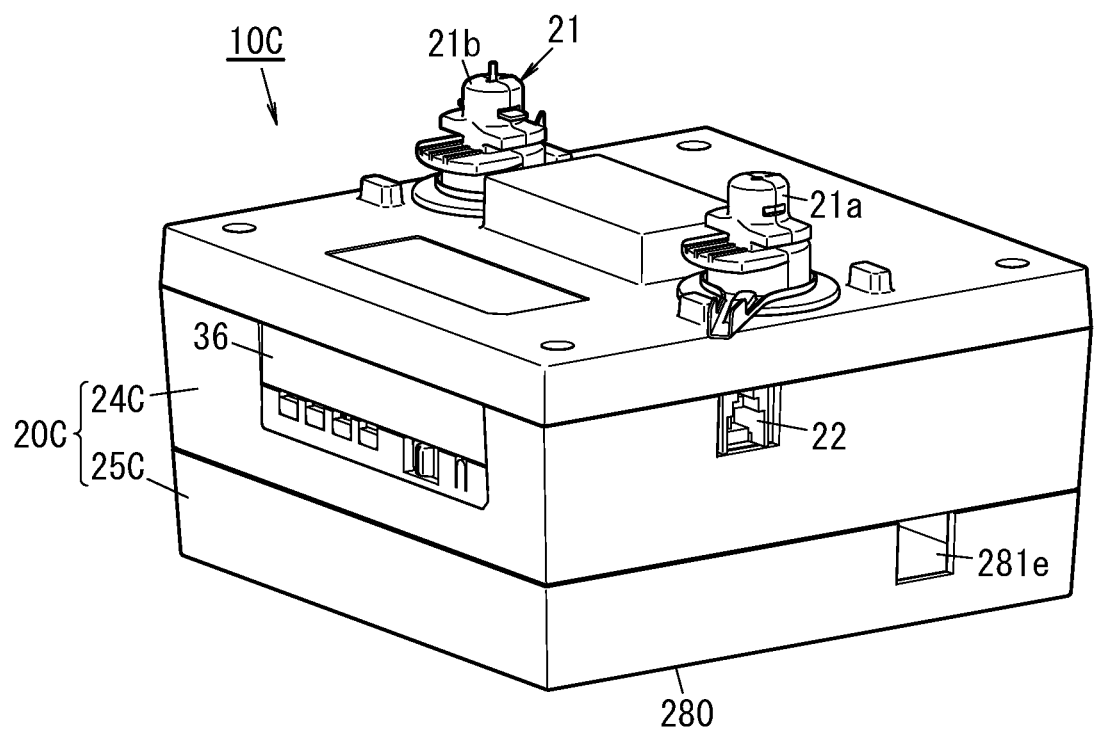
FIG. 11 is a perspective view of an interconnection device of a third variation.

FIG. 11 shows an interconnection device 10C of a third variation. The interconnection device 10C includes a housing 20C different from the housing 20 of the interconnection device 10. The housing 20C includes an accommodation unit 24C and a holding unit 25C respectively different from the accommodation unit 24 and the holding unit 25 of the housing 20.

Figure 12:
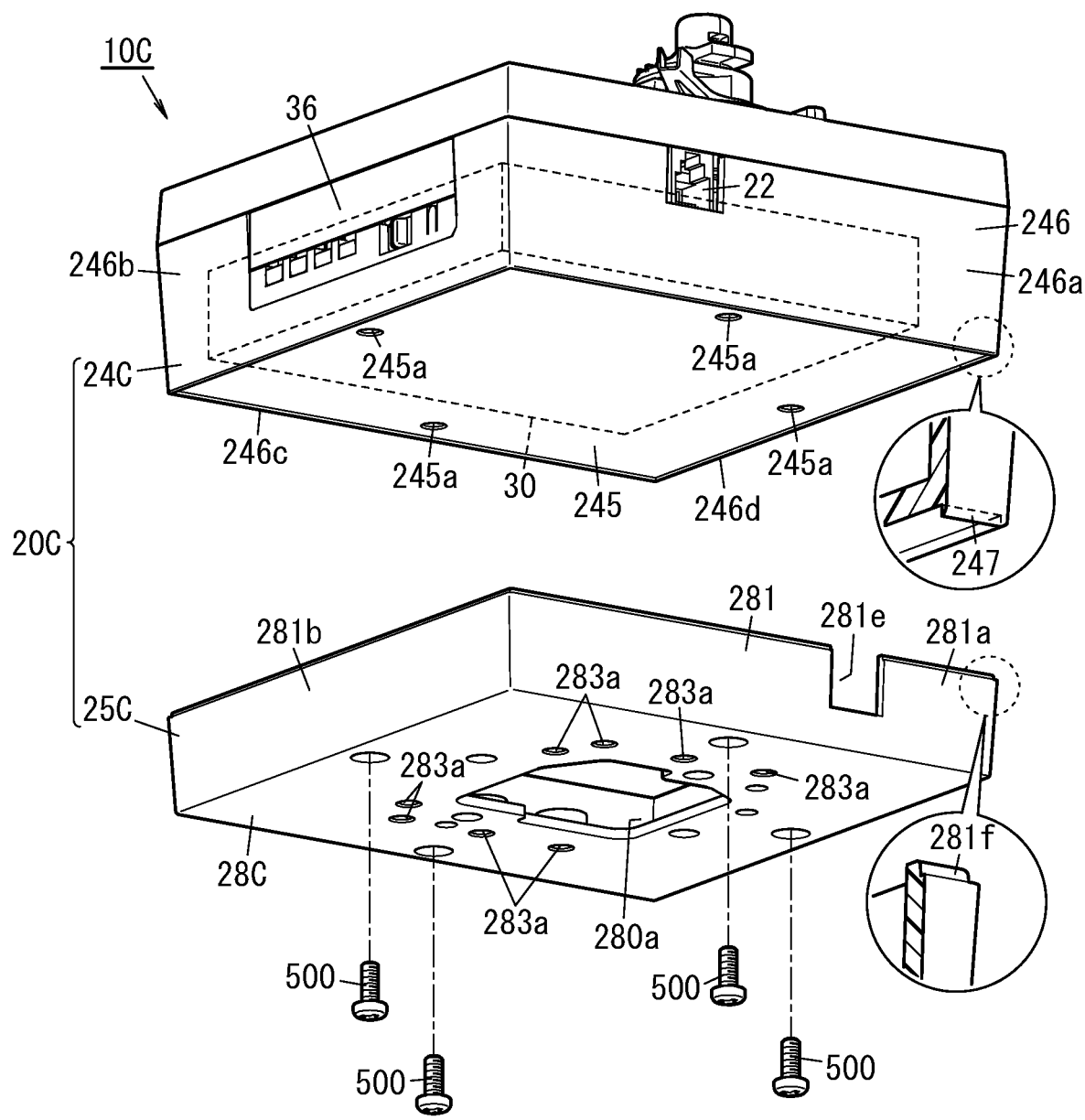
FIG. 12 is a perspective view of the interconnection device of the third variation.
Figure 13:
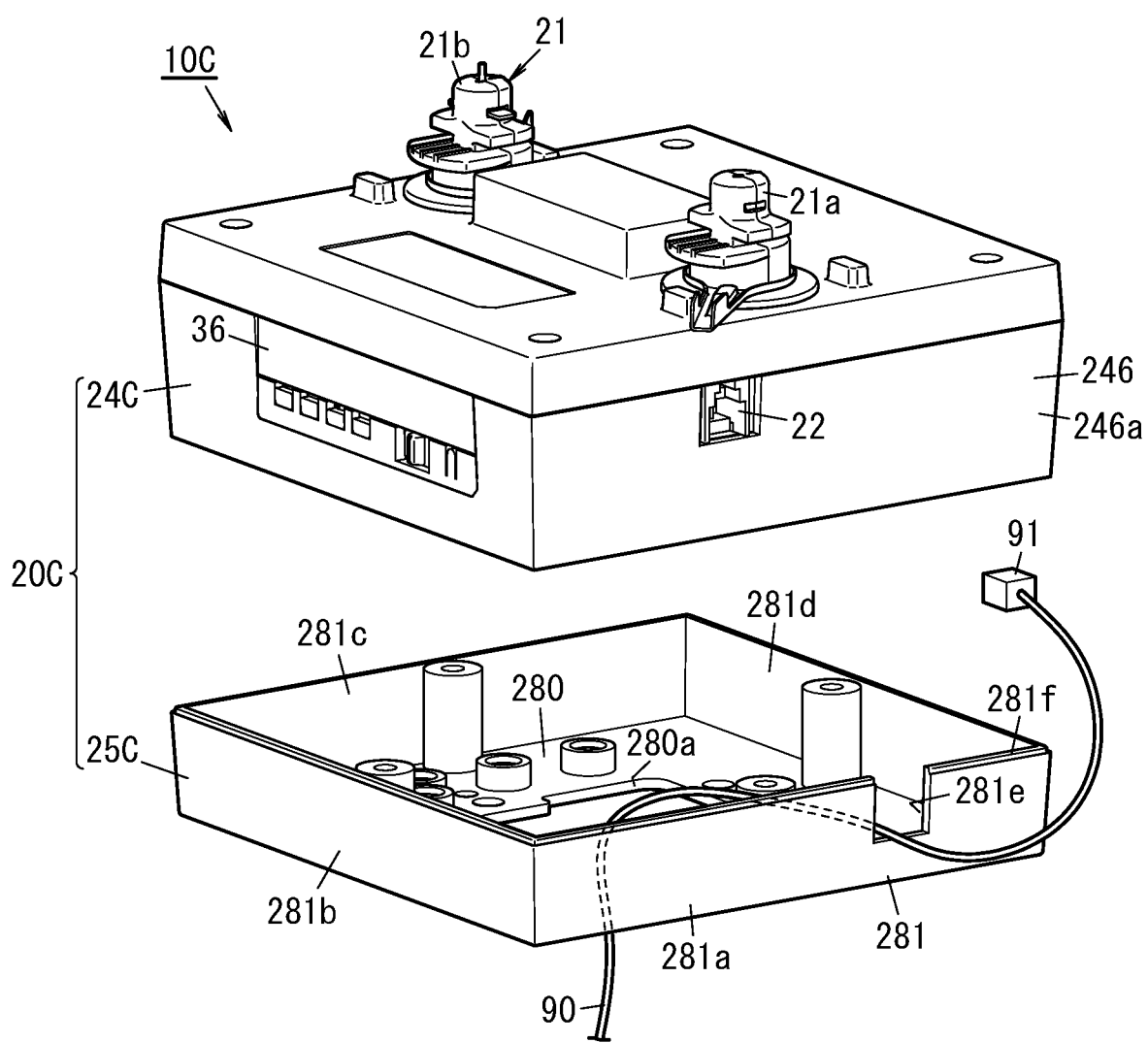
FIG. 13 is another perspective view of the interconnection device of the third variation.

The accommodation unit 24C is formed into a box and is configured to accommodate the circuit block 30. The accommodation unit 24C has a flat box shape as shown in FIG. 11 to FIG. 13. Further, the accommodation unit 24C is square in its plan view. The accommodation unit 24C includes a first surface (upper surface in FIG. 11 to FIG. 13) and a second surface (lower surface in FIG. 11 to FIG. 13) in its thickness direction. The second surface (lower surface in FIG. 11) of the thickness direction of the accommodation unit 24C serves as an attachment surface 245 for physical attachment of the holding unit 25C. As shown in FIG. 12, there are four screw holes 245a formed in the attachment surface 245. The four screw holes 245a are arranged in four fold rotational symmetry around the center of the attachment surface 245. In addition, the accommodation unit 24C includes an outer surrounding surface 246 surrounding the attachment surface 245. The outer surrounding surface 246 includes four outer side surfaces 246a to 246d. The outer side surfaces 246a and 246c are mutually opposite surfaces and the outer side surfaces 246b and 246d are mutually opposite surfaces.

Further, as shown in FIG. 12, the accommodation unit 24C includes a projection (first positioning part) 247 at the attachment surface 245. The projection 247 protrudes from the edge of the attachment surface 245 along the thickness of the accommodation unit 24C. Especially, the projection 247 protrudes from the edge of the attachment surface 245 toward the holding unit 25C to surround the attachment surface 245. The projection 247 has a rectangular frame shape in its plan view.

The accommodation unit 24C is provided with the duct connector 21, the device connector 22, and the auxiliary power supply unit 23. The first and second couplers 21a and 21b of the duct connector 21 are provided to the first surface in the thickness direction (upper surface in FIG. 11) of the accommodation unit 24C. The device connector 22 makes connection with a connector 91 of a connection cable 90 for connecting the device 50. In the present variation, the device connector 22 is a modular jack. In the accommodation unit 24C, the device connector 22 is located at an outer surface different from an outer surface where the attachment surface 245 is located. In more detail, the device connector 22 is located at the outer surrounding surface 246. Especially, the device connector 22 is provided to the outer side surface 246a which is part of the outer surrounding surface 246 of the accommodation unit 24C. In summary, the device connector 22 may be positioned to allow connection of the connection cable 90 to the accommodation unit 24C even while the holding unit 25C is attached to the accommodation unit 24C. The auxiliary power supply unit 23 is provided to an outer side surface 246c which is part of the outer surrounding surface 246 of the accommodation unit 24C. Further, the manual operation unit 36 is exposed on the outer side surface 246b of the accommodation unit 24C. Note that, the device connector 22 may include an openable and closable cover (shutter). Or, the housing 20C may include a cover covering the device connector 22. In such cases, the device connector 22 is still considered to be located at an outer surface of the accommodation unit 24C.

Figure 14:
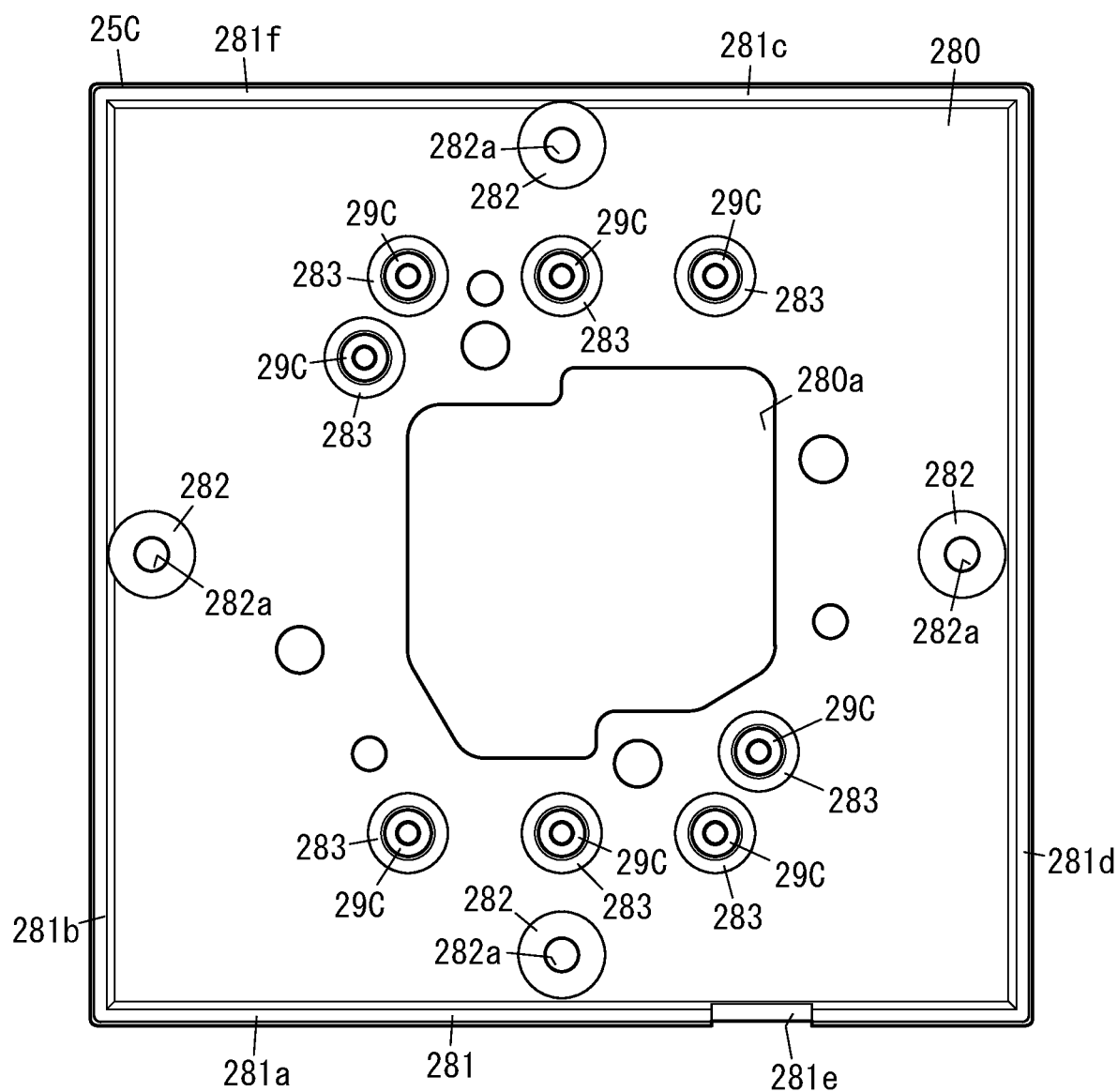
FIG. 14 is a plan of a holding unit of the interconnection device of the third variation.

As shown in FIG. 12 and FIG. 13, the holding unit 25C is a separate unit from the accommodation unit 24C and is physically attached to the attachment surface 245 of the accommodation unit 24C. As shown in FIG. 12, FIG. 13, and FIG. 14, the holding unit 25C includes a body 28C and a plurality of (eight in this regard) attachments 29C. In the present case, each attachment 29C is a nut. Especially, each attachment 29C is a metal nut.

The body 28C is a molded product of resin material with insulating properties. The body 28C includes an attachment plate 280, a surrounding wall 281, a plurality of (four in this case) bosses 282, and a plurality of (eight in this case) holders 283.

The attachment plate 280 is part where the device 50 is attachable. The attachment plate 280 has a rectangular shape (in particular a square shape) in its plan view. The attachment plate 280 includes an opening (first opening) 280a. The opening 280a is used to allow the connection cable 90 (see FIG. 13) for connecting the device 50 to the device connector 22 to pass therethrough. The opening 280a is located at a center of the attachment plate 280. Further, the opening 280a has an almost rectangular shape, and has a size about one ninth as large as that of the attachment plate 280.

Figure 15:
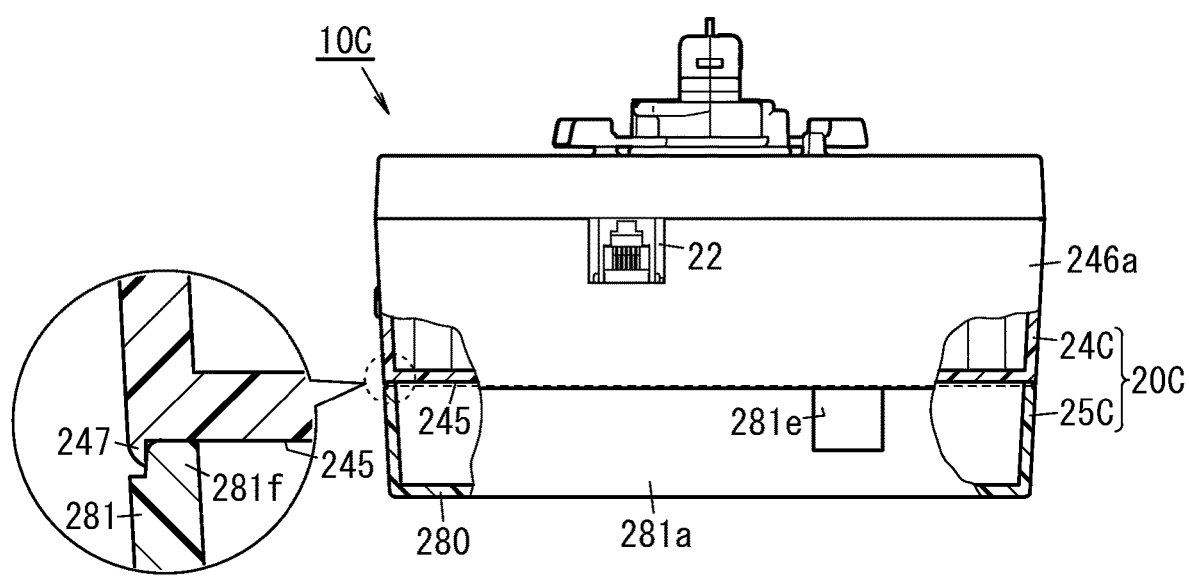
FIG. 15 is a partial section of the interconnection device of the third variation.

The surrounding wall 281 protrudes from the edge of the attachment plate 280 along the thickness of the attachment plate 280. Especially, the surrounding wall 281 protrudes from the edge of the attachment plate 280 toward the accommodation unit 24C to surround the attachment plate 280. The surrounding wall 281 has a rectangular frame shape in its plan view. The surrounding wall 281 includes four side walls 281a to 281d. As for the four side walls 281a to 281d, the side walls 281a and 281c face each other and the side walls 281b and 281d face each other. Further, the surrounding wall 281 includes an opening (second opening) 281e. The opening 281e is used to allow the connection cable 90 (see FIG. 13) for connecting the device 50 to the device connector 22 to pass therethrough. The opening 281e is in the side wall 281a. Further, the opening 281e has an almost rectangular shape. The opening 281e is similar to a cutout, and thus has an open side opposite from the attachment plate 280. Additionally, the surrounding wall 281 has its top end forming a projection (second positioning part) 281f. The projection 281f has a rectangular frame shape, and protrudes from top ends of the four side walls 281a to 281d of the surrounding wall 281 (except for part corresponding to the opening 281e). As shown in FIG. 15, the projection 281f is formed to be engaged with the projection 247 of the accommodation unit 24C. In more detail, the top end of the surrounding wall 281 (the projection 281f) is fitted into an inside of the projection 247 of the attachment surface 245 of the accommodation unit 24C. As described above, the accommodation unit 24C includes a structure (the projection 247) which is provided to the attachment surface 245 to receive the top end (the projection 281f) of the surrounding wall 281. Note that the top end of the surrounding wall 281 may be engaged with the projection 247 of the attachment surface 245 to the extent that the holding unit 25C can be positioned relative to the accommodation unit 24C. In other words, engagement of the top end of the surrounding wall 281 with the projection 247 of the attachment surface 245 may not be required to strongly fix the holding unit 25C to the accommodation unit 24C. Additionally, as shown in FIG. 12, an outer side surface of the projection 281f is closer to the center of the surrounding wall 281 than an outer side surface of a corresponding one of the side walls 281a to 281d is. By doing so, the outer surrounding surface of the surrounding wall 281 is flush with the outer surrounding surface 246 surrounding the attachment surface 245 of the accommodation unit 24C.

The plurality of (four in this case) bosses 282 are used for attachment of the holding unit 25C to the accommodation unit 24C by screws 500. As shown in FIG. 14, the four bosses 282 are provided to the attachment plate 280. The four bosses 282 protrude from the attachment plate 280 toward the accommodation unit 24C. Each boss 282 has a hollow cylindrical shape. Each boss 282 has an open end closer to the attachment plate 280 but has a closed end further from the attachment plate 280. However, each boss 282 is provided at an opposite side from the attachment plate 280 with a hole 282a for allowing a shank of the screw 500 to pass therethrough. As shown in FIG. 14, the four bosses 282 are arranged in four fold rotational symmetry around the center of the attachment plate 280. In more detail, the four bosses 282 are located near the centers of the four side walls 281a to 281d of the surrounding wall 281, respectively.

The plurality of (eight in this case) holders 283 are parts for holding the plurality of (eight in this case) attachments 29C, individually. As shown in FIG. 14, the eight holders 283 are provided to the attachment plate 280. The eight holders 283 protrude from the attachment plate 280 toward the accommodation unit 24C. Each holder 283 has a hollow cylindrical shape. Each holder 283 has an open end closer to the attachment plate 280 but has a closed end further from the attachment plate 280. However, each holder 283 is provided at a side facing the attachment plate 280 with a hole 283a for allowing a shank of a screw for attachment of the device 50 to pass therethrough. The eight attachments 29C are situated in the eight holders 283, individually. In some cases, the attachments 29C are fixed to the holders 283 by thermal compression bonding or the like. The eight holders 283 are arranged in two fold rotational symmetry around the center of the attachment plate 280. In more detail, four of the eight holders 283 are located between the side wall 281a and the opening 280a and remaining four are located between the side wall 281c and the opening 280a.

The holding unit 25C is physically attached to the attachment surface 245 so that the attachment plate 280 faces the attachment surface 245 (see FIG. 12 and FIG. 13). In more detail, by individually screwing the screws 500 into the four screw holes 245a of the accommodation unit 24C through the holes 282a of the four bosses 282 of the holding unit 25C, the holding unit 25C is physically attached to the attachment surface 245 of the accommodation unit 24C. When the holding unit 25C is attached to the accommodation unit 24C, the top end of the surrounding wall 281 (the projection 281f) is fitted into the inside of the projection 247 of the accommodation unit 24C, as shown in FIG. 15. Therefore, connection between the holding unit 25C and the accommodation unit 24C is stabilized. Further, the outer surrounding surface of the surrounding wall 281 is flush with the outer surrounding surface 246 surrounding the attachment surface 245 of the accommodation unit 24C. This also contributes to stabilizing connection between the holding unit 25C and the accommodation unit 24C.

To attach the device 50 to the holding unit 25C, it may be sufficient to fix screws to the attachments 29C by way of holes of the device 50 and the holes 283a of the holders 283. Additionally, to interconnect the device 50 and the device connector 22 by the connection cable 90, it is sufficient to insert the connection cable 90 into the opening 280a of the attachment plate 280 and the opening 281e of the surrounding wall 281 and connect the connector 91 of the connection cable 90 to the device connector 22. In the present variation, part of the connection cable 90 can be accommodated in the holding unit 25C. This can reduce exposure of the connection cable 90 and contribute to protection of the connection cable 90. Moreover, an assembly of the device 50 and the interconnection device 10C can have good appearance.

In this regard, the holding unit 25C is attachable to the accommodation unit 24C in any one of a plurality of locations. Any one of the plurality of locations is a location rotated from a remaining one of the plurality of locations around a rotational axis along a direction in which the attachment surface 245 of the accommodation unit 24C and the attachment plate 280 of the holding unit 25C face each other. In detail, the four bosses 282 and the four screw holes 245a both are arranged in four fold rotational symmetry, and thus the holding unit 25C is attachable to the accommodation unit 24C in any one of four locations.

In one concrete example, the four locations are exemplified by the following first to fourth locations. As shown in FIG. 11, the first location is a location where the side wall 281a of the holding unit 25C and the outer side surface 246a of the accommodation unit 24C are on the same side of the housing 20C. In the first position, the device connector 22 and the second opening 281e are on the same side of the housing 20C. In this case, it is possible to reduce exposure of the connection cable 90 interconnecting the device connector 22 and the device 50. Further, as shown in FIG. 15, the device connector 22 and the second opening 281e are not aligned in a direction in which the attachment surface 245 of the accommodation unit 24C and the attachment plate 280 of the holding unit 25C face each other. In other words, the device connector 22 and the second opening 281e are not arranged side by side in the direction in which the attachment surface 245 of the accommodation unit 24C and the attachment plate 280 of the holding unit 25C face each other. Therefore, in contrast to a case where the device connector 22 and the second opening 281e are aligned in the direction in which the attachment surface 245 of the accommodation unit 24C and the attachment plate 280 of the holding unit 25C face each other, it is possible to reduce curvature of the connection cable 90 interconnecting the device connector 22 and the device 50. Note that, it may be sufficient that at least center positions of the device connector 22 and the second opening 281e are not aligned in the direction in which the attachment surface 245 of the accommodation unit 24C and the attachment plate 280 of the holding unit 25C face each other. In a preferable example, the device connector 22 and the second opening 281e are not overlapped with each other in the direction in which the attachment surface 245 of the accommodation unit 24C and the attachment plate 280 of the holding unit 25C face each other. Additionally or alternatively, the second opening 281e may be larger than the device connector 22 to allow selection of a location where the connection cable 90 is pulled out. This also can contribute to reduction of the curvature of the connection cable 90 interconnecting the device connector 22 and the device 50.

Figure 16:
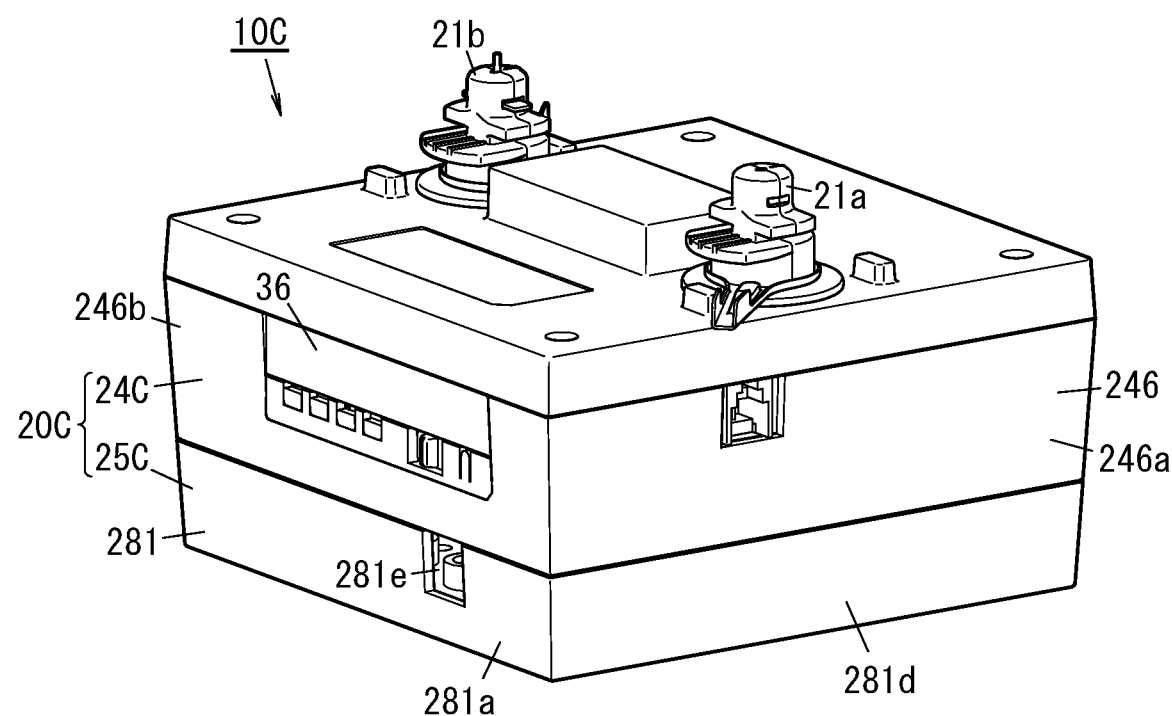
FIG. 16 is another perspective view of the interconnection device of the third variation.

As shown in FIG. 16, the second location is a location where the side wall 281a of the holding unit 25C and the outer side surface 246b of the accommodation unit 24C are on the same side of the housing 20C. In other words, the second location is a location of the holding unit 25C rotated clockwise in a plan view around a rotational axis along the direction in which the attachment surface 245 of the accommodation unit 24C and the attachment plate 280 of the holding unit 25C face each other, from the first position, by 90 degrees. The third location is a location where the side wall 281a of the holding unit 25C and the outer side surface 246c of the accommodation unit 24C are on the same side of the housing 20C. In other words, the third location is a location of the holding unit 25C rotated clockwise in a plan view around the aforementioned rotational axis, from the first position, by 180 degrees. The fourth location is a location where the side wall 281a of the holding unit 25C and the outer side surface 246d of the accommodation unit 24C are on the same side of the housing 20C. In other words, the fourth location is a location of the holding unit 25C rotated clockwise in a plan view around the aforementioned rotational axis, from the first position, by 270 degrees.

As described above, the holding unit 25C is attachable to the accommodation unit 24C in any one of the plurality of locations. Therefore, the degree of freedom of attachment of the device 50 can be improved.

2.4 Fourth Variation

Figure 17:
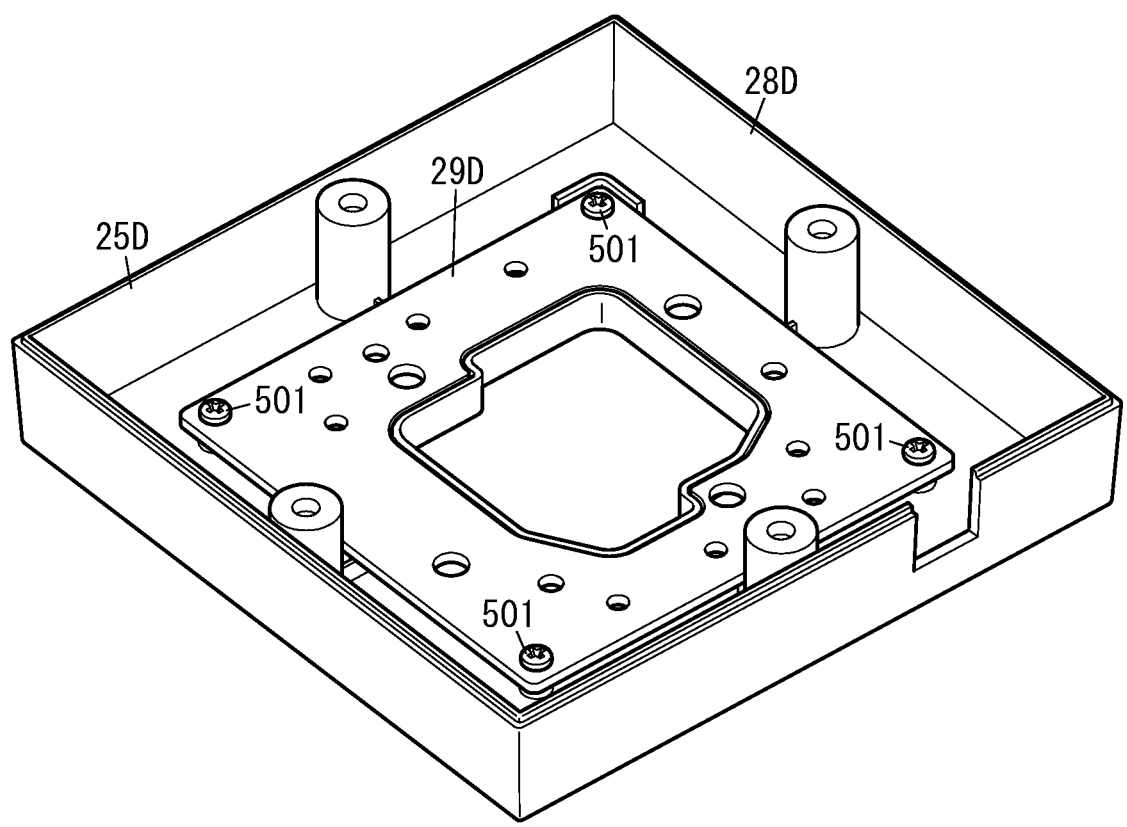
FIG. 17 is a perspective view of a holding unit of an interconnection device of a fourth variation.
Figure 18:
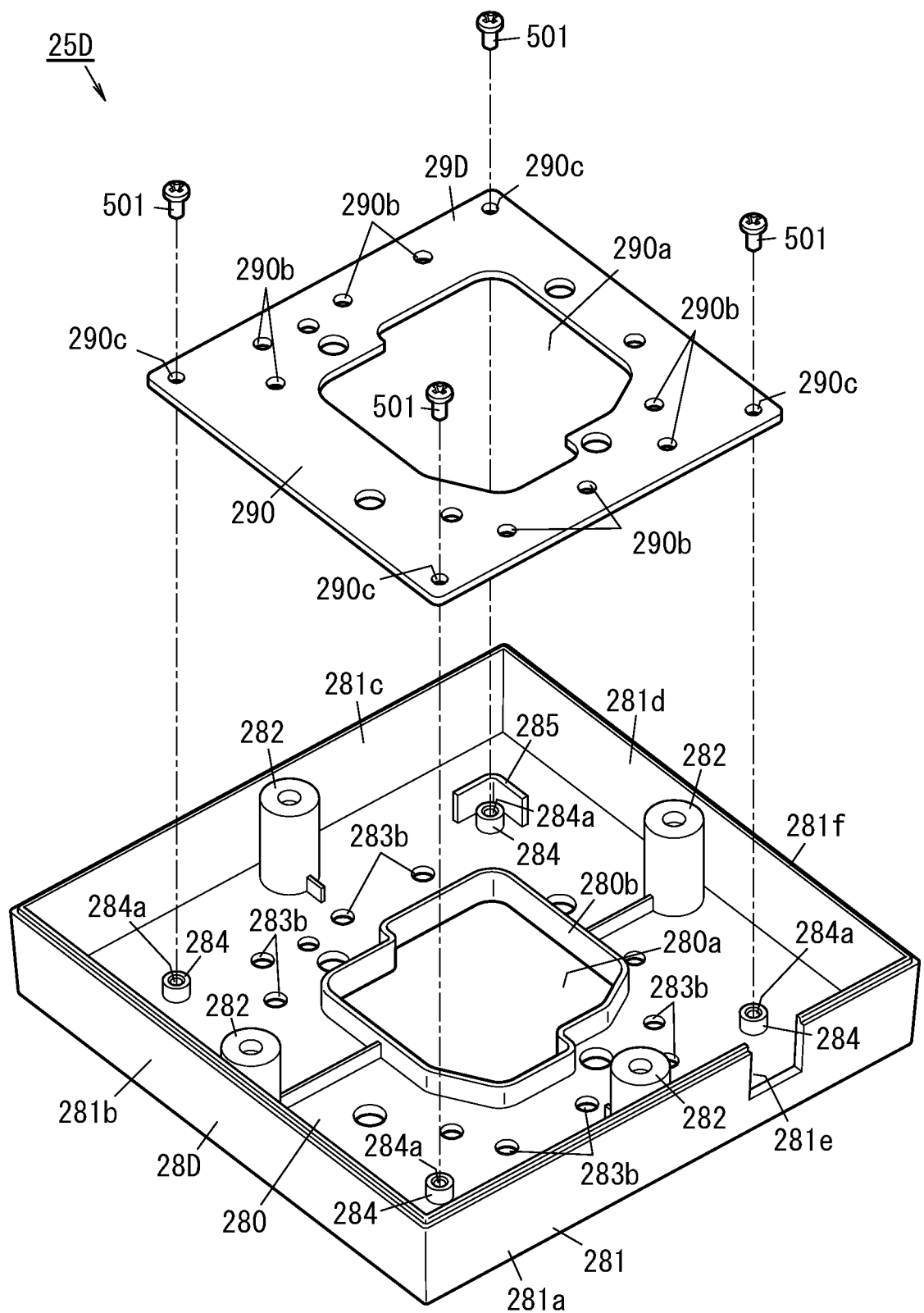
FIG. 18 is an exploded perspective view of the holding unit of the interconnection device of the fourth variation.
Figure 19:
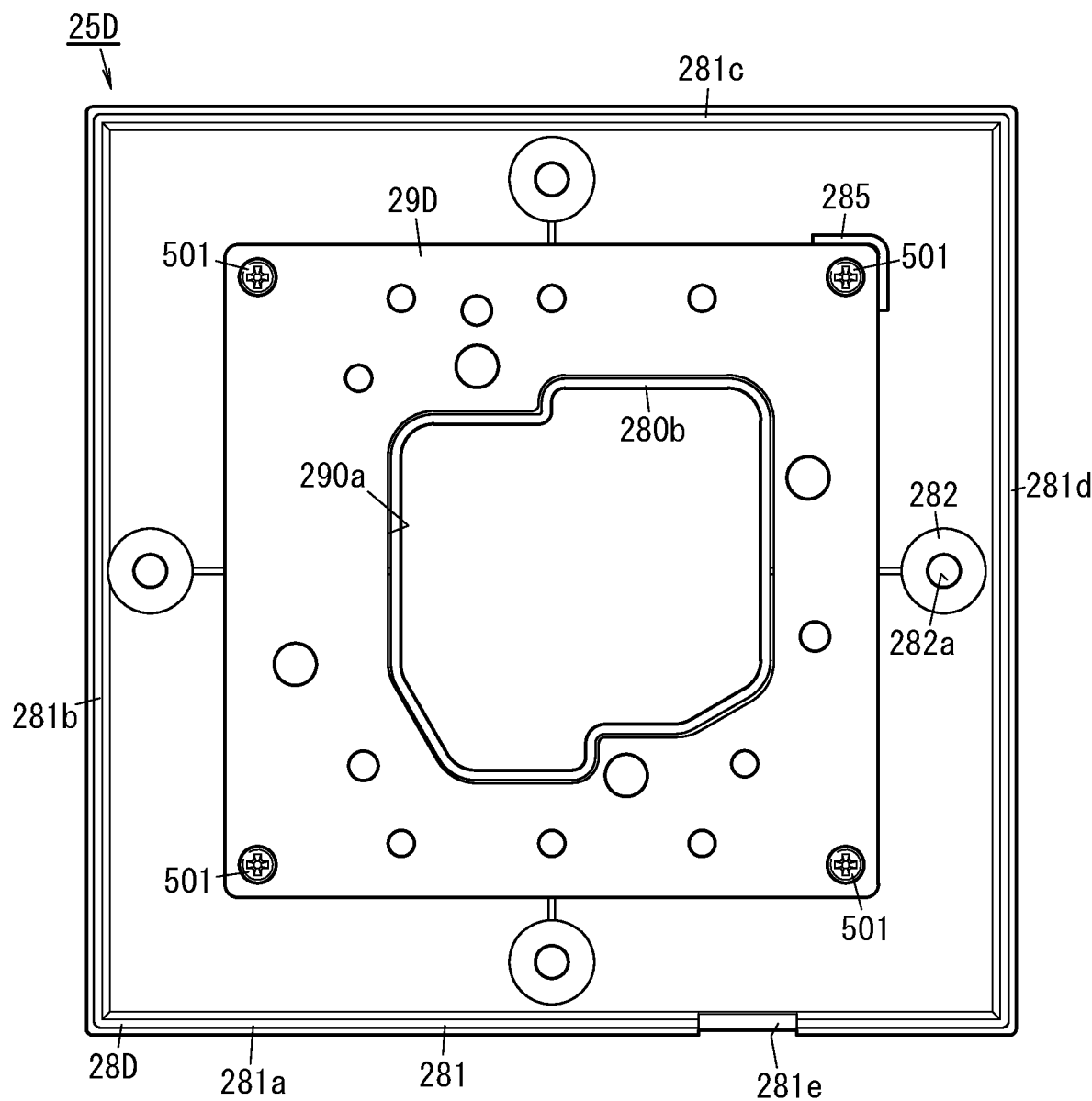
FIG. 19 is a plan of the holding unit of the interconnection device of the fourth variation.

As shown in FIG. 17 to FIG. 19, an interconnection device of a fourth variation includes a holding unit 25D different from the holding unit 25C of the interconnection device 10C of the third variation. The interconnection device of the fourth variation may include the accommodation unit 24C of the interconnection device 10C of the third variation.

The holding unit 25D is a separate unit from the accommodation unit 24C and is physically attached to the attachment surface 245 of the accommodation unit 24C. As shown in FIG. 17, FIG. 18, and FIG. 19, the holding unit 25D includes a body 28D and a fixed plate 29D.

The body 28D is a molded product of resin material with insulating properties. Similarly to the body 28C of the third variation, the body 28D includes the attachment plate 280, the surrounding wall 281, and the plurality of (four in this case) bosses 282.

The attachment plate 280 in the present variation is similar to that in the third variation. However, the attachment plate 280 in the present variation further includes a surrounding wall part 280b and a plurality of (eight in this case) holes 283b. The surrounding wall part 280b protrudes from the periphery of the opening 280a of the attachment plate 280 toward the fixed plate 29D (upward in FIG. 18). The surrounding wall part 280b surrounds the entire periphery of the opening 280a. Each hole 283b is provided to allow a shank of a screw for attachment of the device 50 to pass therethrough. The eight holes 283b are arranged in two fold rotational symmetry around the center of the attachment plate 280. In more detail, four of the eight holes 283b are located between the side wall 281a and the opening 280a and remaining four are located between the side wall 281c and the opening 280a.

The body 28D further includes a plurality of (four in this case) bosses 284 and a protrusion 285.

As shown in FIG. 18, the plurality of (four in this case) bosses 284 are used for attachment of the fixed plate 29D to the body 28D by screws 501. The four bosses 284 are provided to the attachment plate 280. The four bosses 284 protrude from the attachment plate 280 toward the fixed plate 29D. Each boss 284 has a solid cylindrical shape. Each boss 284 includes a screw hole 284a corresponding to a screw 501, at its top end. The four bosses 284 are arranged in four fold rotational symmetry around the center of the attachment plate 280. In more detail, the four bosses 284 are located near four corners of the attachment plate 280, individually.

The protrusion 285 is used for positioning the fixed plate 29D relative to the body 28D. The protrusion 285 is provided to the attachment plate 280. The protrusion 285 has an L-shape in its plan view. The protrusion 285 is located near one of the four bosses 284. In this regard, the protrusion 285 is located corresponding to a corner between the side walls 281c and 281d.

The fixed plate 29D is a metal plate. The fixed plate 29D has a rectangular shape (in particular a square shape) in its plan view. The fixed plate 29D has a smaller size than the attachment plate 280. As shown in FIG. 18, the fixed plate 29D includes an opening (third opening) 290a, a plurality of (eight in this case) screw holes 290b, and a plurality of (four in this case) holes 290c. The opening 290a is used to allow the connection cable 90 (see FIG. 13) for connecting the device 50 to the device connector 22 to pass therethrough.

The opening 290*a* is located at a center of the fixed plate 29D. Further, the opening 290*a* has a size so that the entire surrounding wall part 280*b* is positioned inside the opening 290*a*. In this regard, the surrounding wall part 280*b* is fitted into the opening 290*a*. The eight screw holes 290*b* correspond to screws for attachment of the device 50, individually. Further, the eight screw holes 290*b* are formed in parts of the fixed plate 29D facing the eight holes 283*b* of the body 28D, individually. The four holes 290*c* are used for fixing the fixed plate 29D to the body 28D. The four holes 290*c* are formed in parts of the fixed plate 29D facing the four bosses 284 of the body 28D, individually. In this regard, the four holes 290*c* are located near four corners of the fixed plate 29D, individually.

To fix the fixed plate 29D to the attachment plate 280 (the body 28D), it may be sufficient to fix the screws 501 into screw holes 284*a* of the four bosses 284 through the four holes 290*c*. In this regard, positioning the fixed plate 29D relative to the body 28D can be performed easily by bringing any one of the corners of the fixed plate 29D into contact with an inside corner of the protrusion 285 of the body 28D. Further, the surrounding wall part 280*b* of the body 28D is fitted into the opening 290*a* of the fixed plate 29D and accordingly the fixed plate 29D is held by the body 28D temporarily. Thus, connection by use of the screws 501 can be facilitated.

The holding unit 25D is physically attached to the attachment surface 245 so that the attachment plate 280 faces the attachment surface 245. In more detail, by individually screwing the screws 500 into the four screw holes 245*a* of the accommodation unit 24C through the holes 282*a* of the four bosses 282 of the holding unit 25D, the holding unit 25D is physically attached to the attachment surface 245 of the accommodation unit 24C. When the holding unit 25D is attached to the accommodation unit 24C, the top end of the surrounding wall 281 (the projection 281*f*) is fitted into the inside of the projection 247 of the accommodation unit 24C similarly to the third variation.

To attach the device 50 to the holding unit 25D, it may be sufficient to fix screws to the fixed plate 29D by way of holes of the device 50 and the holes 283*b* of the body 28D. Since the fixed plate 29D is made of metal, the holding unit 25D can be attached to the device 50 more firmly than in the case where the device 50 is directly fixed to the attachment plate 280 made of resin. Additionally, to interconnect the device 50 and the device connector 22 by the connection cable 90, it is sufficient to insert the connection cable 90 into the opening 280*a* of the attachment plate 280, the opening 290*a* of the fixed plate 29D, and the opening 281*e* of the surrounding wall 281 and connect the connector 91 of the connection cable 90 to the device connector 22. In the present variation, part of the connection cable 90 can be accommodated in the holding unit 25C. This can reduce exposure of the connection cable 90 and contribute to protection of the connection cable 90. Moreover, an assembly of the device 50 and the interconnection device of the fourth variation can have good appearance.

In the present variation, the holding unit 25D is attachable to the accommodation unit 24C in any one of a plurality of locations.

2.5 Fifth Variation

Figure 20:
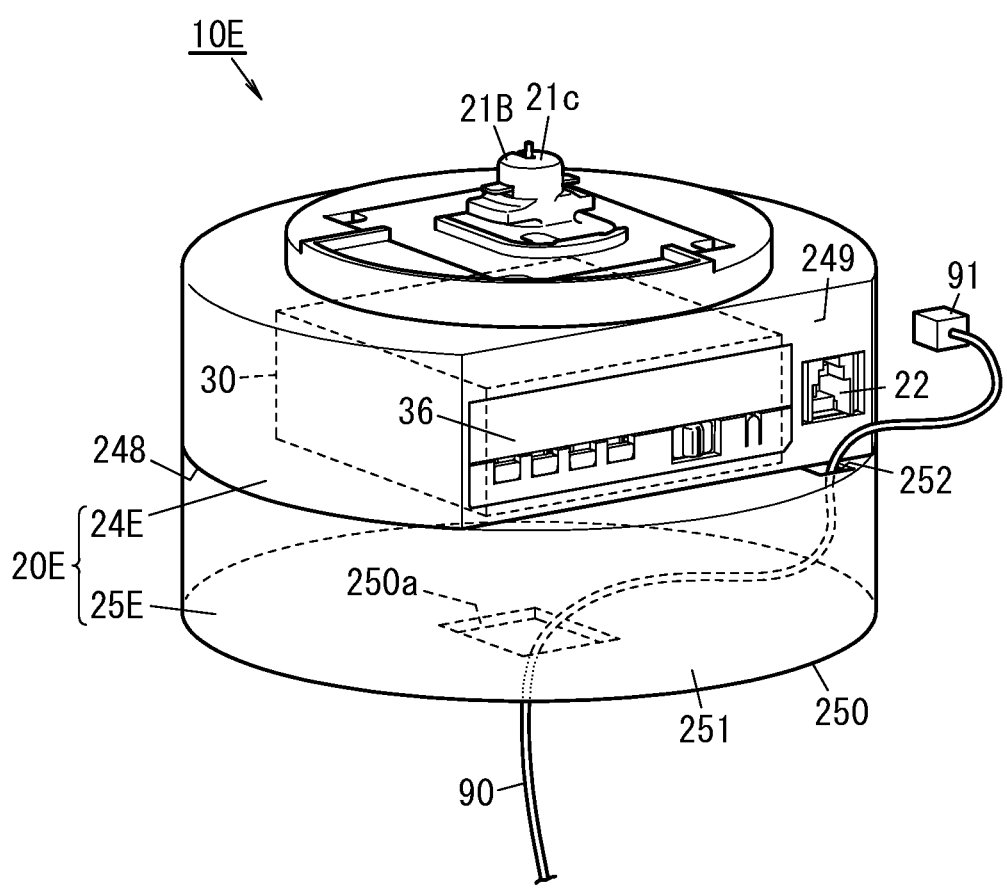
FIG. 20 is a perspective view of an interconnection device of a fifth variation.

FIG. 20 shows an interconnection device 10E of a fifth variation. The interconnection device 10E includes a housing 20E different from the housing 20 of the interconnection device 10. The housing 20E includes an accommodation unit 24E and a holding unit 25E respectively different from the accommodation unit 24 and the holding unit 25 of the housing 20.

The accommodation unit 24E is formed into a box and is configured to accommodate the circuit block 30. The accommodation unit 24E has a hollow cylindrical box shape. The accommodation unit 24E has a first surface (upper surface in FIG. 20) and a second surface (lower surface in FIG. 20) in its thickness direction. The accommodation unit 24E has a center of the first surface in its thickness direction (upper surface in FIG. 20) which protrudes to have a hollow cylindrical shape. Further, the second surface in the thickness direction (lower surface in FIG. 20) of the accommodation unit 24E serves as an attachment surface 248 for physical attachment of the holding unit 25E. Moreover, the accommodation unit 24E includes a surface 249 which is flat and part of the outer surrounding surface enclosing the attachment surface 248.

The accommodation unit 24E is provided with the duct connector 21B, the device connector 22, and the auxiliary power supply unit 23. The duct connector 21B is provided to the first surface in the thickness direction (upper surface in FIG. 20) of the accommodation unit 24E. The duct connector 21B includes a single coupler 21*c*. The coupler 21*c* is located at a center of the first surface in the thickness direction of the accommodation unit 24E. The device connector 22 is provided to a different surface of the accommodation unit 24E from the attachment surface 248. In detail, the device connector 22 is provided to the surface 249 which is flat and is part of the outer surrounding surface. The auxiliary power supply unit 23 is provided to the outer surrounding surface of the accommodation unit 24E. Note that, in FIG. 20, since the auxiliary power supply unit 23 is on an opposite side from the device connector 22, the auxiliary power supply unit 23 is out of sight. Further, exposed on the flat surface 249 of the accommodation unit 24E is the manual operation unit 36.

The holding unit 25E is a separate unit from the accommodation unit 24E and is physically attached to the attachment surface 248 of the accommodation unit 24E. In one example, the holding unit 25E is physically attached to the attachment surface 248 of the accommodation unit 24E with screws or the like.

The holding unit 25E is formed into a box. The holding unit 25E has a hollow cylindrical box shape. In a plan view, the holding unit 25E and the accommodation unit 24E have the same radius (diameter). The holding unit 25E is a molded product of resin material with insulating properties. The holding unit 25E includes an attachment plate 250 and a surrounding wall 251. The attachment plate 250 is part where the device 50 is attached. The attachment plate 250 is circular in its plan view. The attachment plate 250 includes an opening (first opening) 250*a*. The opening 250*a* is used to allow the connection cable 90 for connecting the device 50 to the device connector 22 to pass therethrough. The opening 250*a* is located at a center of the attachment plate 250. Further, the opening 250*a* is almost rectangular. In one example, the attachment plate 250 is attached to the device 50 with screws or the like. The surrounding wall 251 protrudes from the edge of the attachment plate 250 along the thickness of the attachment plate 250. Especially, the surrounding wall 251 protrudes from the edge of the attachment plate 250 toward the accommodation unit 24E to surround the attachment plate 250. The surrounding wall 251 has a circular frame shape in its plan view. Further, the holding unit 25E includes an opening 252 at a surface facing the accommodation unit 24E, that is, an opposite end of the surrounding wall 251 from the attachment plate 250. The opening 252 is used to allow the connection cable 90 for connecting the device 50 to the device connector 22 (see FIG. 20) to pass therethrough The holding unit 25E is physically attached to the attachment surface 248 so that the attachment plate 250 faces the attachment surface 248. In this regard, the holding unit 25E is attached to the accommodation unit 24E to expose the opening 252.

2.6 Other Variations

The housing (20, 20A, 20B, 20C, 20E) of the interconnection device (10, 10A, 10B, 10C, 10E) may not be limited to the aforementioned configuration. Especially, the duct connector (21, 21B), the device connector 22, and the auxiliary power supply unit 23 may have conventional shapes as long as they can implement their functions. For example, the duct connector (21, 21B) may be physically attached to the wiring duct 40 at at least one part thereof. The shape of the duct connector (21, 21B) may be changed according to the shape of the wiring duct 40. In the above embodiment, communication with the device 50 and power supply to the device 50 are performed by one device connector 22. However, communication with the device 50 and power supply to the device 50 may be performed by separate device connectors 22. In other words, in the output unit 32, the second communication unit 321 and the conversion unit 322 may be connected to the device 50 by different connection cables 80, respectively. Further, the device connector 22 may not be configured to be connected to the device 50 through the connection cable 80. Further, in the interconnection device (10C, 10E), the device connector (22) may be provided to the attachment surface (245, 248) of the accommodation unit (24C, 24E). In this case, a junction between the connection cable (90) and the device connector (22) can be concealed by the holding unit (25C, 25D, 25E). Note that, the device connector (22) may be provided to not the attachment surface (245, 248) of the accommodation unit (24C, 24E) as such, but a protruded part protruding from the attachment surface (245, 248). In this case, the device connector (22) can be directed in a different direction from the attachment surface (245, 248). In one example, the connector (91) of the connection cable (90) can be connected to the device connector (22) in a direction perpendicular to a normal direction of the attachment surface (245, 248). By doing so, the housing (20C, 20E) can be thinned. Further, the housing (20, 20A, 20B, 20C, 20E) may include a plurality of device connectors 22 or in contrast may not include the device connector 22. When the device connector 22 is absent, the output unit 32 may perform communication with or power supply to the device 50 in a wireless manner. The auxiliary power supply unit 23 may be optional.

Regarding the housing (20, 20A, 20B, 20C, 20E), the holding unit (25, 25A, 25B, 25C, 25D, 25E) may be formed integrally with the accommodation unit (24, 24A, 24B, 24C, 24E). The structure of the holding unit (25, 25A, 25B, 25C, 25E) may not be limited to the aforementioned example. The holding unit (25, 25A) may include either the first holder (26, 26A) or the second holder (27, 27A). The housing (20, 20A, 20B, 20C, 20E) may not include the holding unit (25, 25A, 25B, 25C, 25D, 25E). In summary, it is sufficient that the housing (20, 20A, 20B, 20C, 20E) includes at least the accommodation unit (24, 24A, 24B, 24C, 24E).

The circuit block 30 of the interconnection device (10, 10A, 10B, 10C, 10E) may include one or more batteries and may be configured to operate with power from the one or more batteries. In this variation, it is not always necessary for the interconnection device (10, 10A, 10B, 10C, 10E) to obtain power from the wiring duct 40. This means that the interconnection device (10, 10A, 10B, 10C, 10E) may not include the power supply unit 34. Further, the interconnection device (10, 10A, 10B, 10C, 10E) may include one or more charging circuits for changing the one or more batteries. In such cases, the interconnection device (10, 10A, 10B, 10C, 10E) can operate even if it cannot receive power from the wiring duct 40. The interconnection device (10, 10A, 10B, 10C, 10E) may not include the processing unit 33. In this variation, it is sufficient to enable signal transmission and reception between the first communication unit 31 and the second communication unit 321 of the output unit 32. The interconnection device (10, 10A, 10B, 10C, 10E) may not include the announcement unit 35 and the manual operation unit 36. To sum up, the interconnection device (10, 10A, 10B, 10C, 10E) includes at least the housing 20, the first communication unit 31, and the output unit 32. In this regard, the first communication unit 31 may include at least one of the receiving function and the sending function. Similarly, the second communication unit 321 may include at least one of the receiving function and the sending function.

The wiring duct 40 may not be limited to having the aforementioned configuration but may have a conventional configuration (e.g., a duct rail, and a lighting rail). In summary, used as the wiring duct 40 may be a rail which is installed in facilities to deliver power. Note that, in the aforementioned embodiment, the wiring duct 40 is installed on the ceiling of the facilities, but may be installed on a wall of the facilities. A place where the wiring duct 40 is installed may not be limited particularly.

In the device system, the management device 60 and the adaptor 70 are optional. In summary, the device system may include at least the interconnection device (10, 10A, 10B, 10C, 10E), the wiring duct 40, and the device 50. Further, the numbers of interconnection devices (10, 10A, 10B, 10C, 10E), wiring ducts 40, and devices 50 each may not be limited particularly. In summary, it is sufficient that the device system includes one or more interconnection devices (10, 10A, 10B, 10C, 10E), one or more wiring ducts 40, and one or more devices 50. Note that, in the case where the device system includes a plurality of interconnection devices (10, 10A, 10B, 10C, 10E), one or more of addresses of the interconnection devices (10, 10A, 10B, 10C, 10E) may be included in a first communication signal to designate a destination of the first communication signal.

The facilities where the device system is installed may not be limited to factories. The facilities may be residential facilities (e.g., single dwellings and multiple dwellings) or nonresidential facilities (e.g., factories, commerce facilities, hospitals, offices, and buildings).

One or more entities of the aforementioned interconnection device include a computer system. The computer system includes main hardware components including one or more processors and one or more memories. The one or more processors execute one or more programs recorded in the one or more memories of the computer system, thereby functioning as the one or more entities of the interconnection device in the present disclosure. Such one or more programs may be stored in the one or more memories of the computer system in advance, or may be provided through telecommunication circuits, or may be provided with being recorded in one or more non-transitory recording media readable by computer systems. Examples of the non-transitory recording media readable by computer systems may include memory cards, optical disks, and hard disk drive. A processor of such a computer system may include one or more electronic circuits including a semiconductor integrated circuit (IC) or a large scale integrated circuit (LSI). In this paragraph, an integrated circuit is referred to as an IC or an LSI. However, an integrated circuit may be called in different ways depending on the degree of integration. An integrated circuit which may be referred to as a system LSI, a very large scale integration (VLSI), or an ultralarge scale integration (ULSI) may be used. A field programmable gate array (FGPA) in which programming is done after manufacture of an LSI, or a logical device enabling reconstruction of connection relations inside an LSI or setup of circuit sections inside an LSI may be used for the same purpose. The electronic circuits may be aggregated into one chip, or distributed to chips. The chips may be aggregated into one device, or distributed to devices.

3. Aspects

As obviously understood from the embodiments and variations, the present disclosure contains the following aspects. In the following, the reference signs in parentheses are introduced in order to clearly indicate relation between the aspects and the embodiment and variations.

An interconnection device (10; 10A; 10B; 10C; 10E) according to a first aspect includes a housing (20; 20A; 20B; 20C; 20E) and a first communication unit (31) and an output unit (32) which are accommodated in the housing (20; 20A; 20B; 20C; 20E). The housing (20; 20A; 20B; 20C; 20E) includes a duct connector (21; 21B) physically attachable and electrically connectable to a wiring duct (40) for transferring first power. The first communication unit (31) is connectable to the wiring duct (40) through the duct connector (21; 21B), and is configured to perform communication in a power line communication scheme through the wiring duct (40). The output unit (32) includes a second communication unit (321) and a conversion unit (322). The second communication unit (321) is configured to communicate with a device (50) in a telecommunication standard different from the power line communication scheme. The conversion unit (322) is configured to generate second power of a different standard from the first power based on the first power obtained from the wiring duct (40) through the duct connector (21; 21B) and supply the second power to the device (50). Accordingly, the first aspect enables communication and power supply to a device (50) by use of a wiring duct (40) even if the device (50) uses a different power standard from the wiring duct (40).

An interconnection device (10; 10A; 10B; 10C; 10E) according to a second aspect would be realized in combination with the first aspect. In the second aspect, the housing (20; 20A; 20B; 20C; 20E) further includes a device connector (22) connectable to the device (50) through a connection cable (80; 90). The second communication unit (321) is configured to communicate with the device (50) through the connection cable (80; 90) connected to the device connector (22). The conversion unit (322) is configured to supply the second power to the device (50) through the connection cable (80; 90) connected to the device connector (22). According to the second aspect, connection for communication and power supply between the interconnection device (10; 10A; 10B; 10C; 10E) and the device (50) can be made easily.

An interconnection device (10; 10A; 10B; 10C; 10E) according to a third aspect would be realized in combination with the first aspect. In the third aspect, the housing (20; 20A; 20B; 20C; 20E) further includes a holding unit (25; 25A; 25B; 25C; 25D; 25E) configured to physically hold the device (50). According to the third aspect, it is possible to easily change the position of the device (50).

An interconnection device (10; 10A; 10B; 10C; 10E) according to a fourth aspect would be realized in combination with the third aspect. In the fourth aspect, the housing (20; 20A; 20B; 20C; 20E) includes an accommodation unit (24; 24A; 24B; 24C; 24E) configured to accommodate the first communication unit (31) and the output unit (32). The holding unit (25; 25A; 25B; 25C; 25D; 25E) is a separate unit from the accommodation unit (24; 24A; 24B; 24C; 24E) and is physically attached to the accommodation unit (24; 24A; 24B; 24C; 24E). According to the fourth aspect, it is possible to facilitate attachment of the device (50) to the interconnection device (10; 10A; 10B; 10C; 10E).

An interconnection device (10; 10A; 10B) according to a fifth aspect would be realized in combination with the third or fourth aspect. In the fifth aspect, the housing (20; 20A; 20B) further includes a device connector (22) connectable to the device (50) through a connection cable (80). The holding unit (25; 25A; 25B) and the device connector (22) are on a same side of the housing (20; 20A; 20B). According to the fifth aspect, it is possible to facilitate connection between the device connector (22) and the device (50) through the connection cable (80).

An interconnection device (10; 10A; 10B) according to a sixth aspect would be realized in combination with the fifth aspect. In the sixth aspect, the second communication unit (321) is configured to communicate with the device (50) through the connection cable (80) connected to the device connector (22). The conversion unit (322) is configured to supply the second power to the device (50) through the connection cable (80) connected to the device connector (22). According to the sixth aspect, connection for communication and power supply between the interconnection device (10; 10A; 10B) and the device (50) can be made easily.

An interconnection device (10C; 10E) according to a seventh aspect would be realized in combination with the fourth aspect. In the seventh aspect, the holding unit (25C; 25D; 25E) includes an attachment plate (280; 250) to which the device (50) is attachable, and a surrounding wall (281; 251). The surrounding wall (281; 251) protrudes from an edge of the attachment plate (280; 250) toward the accommodation unit (24C; 24E) to surround the attachment plate (280; 250). The accommodation unit (24C; 24E) includes an attachment surface (245; 248). The holding unit (25C; 25D; 25E) is physically attached to the attachment surface (245; 248) to allow the attachment plate (280; 250) to face the attachment surface (245; 248). According to the seventh aspect, connection between the holding unit (25C; 25D; 25E) and the accommodation unit (24C; 24E) is stabilized.

An interconnection device (10C) according to an eighth aspect would be realized in combination with the seventh aspect. In the eighth aspect, the accommodation unit (24C) further includes a device connector (22) which is located on an outer surface (246) different from the attachment surface (245) and is connectable to the device (50) through a connection cable (90). The attachment plate (280) includes a first opening (280*a*) allowing the connection cable (90) to pass therethrough. The surrounding wall (281) includes a second opening (281*e*) allowing the connection cable (90) to pass therethrough. According to the eighth aspect, it is possible to facilitate connection between the device connector (22) and the device (50) through the connection cable (90).

An interconnection device (10C) according to a ninth aspect would be realized in combination with the eighth aspect. In the ninth aspect, the connection cable (90) goes into an inside of the holding unit (25C; 25D) through the first opening (280a), goes out from the inside of the holding unit (25C; 25D) to an outside of the holding unit (25C; 25D) through the second opening (281e), and is connected to the device connector (22). According to the ninth aspect, it is possible to facilitate connection between the device connector (22) and the device (50) through the connection cable (90).

An interconnection device (10C) according to a tenth aspect would be realized in combination with the eighth or ninth aspect. In the tenth aspect, the device connector (22) and the second opening (281e) are on a same side of the housing (20C). According to the tenth aspect, it is possible to reduce exposure of the connection cable (90) interconnecting the device connector (22) and the device (50).

An interconnection device (10C) according to an eleventh aspect would be realized in combination with the tenth aspect. In the eleventh aspect, the device connector (22) and the second opening (281e) are not aligned in a direction in which the attachment surface (245) of the accommodation unit (24C) and the attachment plate (280) of the holding unit (25C; 25D) face each other. According to the eleventh aspect, it is possible to reduce curvature of the connection cable (90) interconnecting the device connector (22) and the device (50).

An interconnection device (10C) according to a twelfth aspect would be realized in combination with any one of the seventh to eleventh aspects. In the twelfth aspect, the holding unit (25C; 25D) is attachable to the accommodation unit (24C) in any one of a plurality of locations. Any one of the plurality of locations is a location rotated from a remaining one of the plurality of locations around a rotational axis along a direction in which the attachment surface (245) of the accommodation unit (24C) and the attachment plate (280) of the holding unit (25C; 25D) face each other. According to the twelfth aspect, the degree of freedom of attachment of the device (50) can be improved.

An interconnection device (10; 10A; 10B; 10C; 10E) according to a thirteenth aspect would be realized in combination with any one of the seventh to twelfth aspects. In the thirteenth aspect, an outer surrounding surface of the surrounding wall (281) is flush with an outer surrounding surface (246) surrounding the attachment surface (245) of the accommodation unit (24C). Accordingly, the thirteenth aspect can contribute to stabilizing connection between the holding unit (25C; 25D) and the accommodation unit (24C).

An interconnection device (10C) according to a fourteenth aspect would be realized in combination with any one of the seventh to thirteenth aspects. In the fourteenth aspect, the accommodation unit (24C) includes a structure (247) which is provided to the attachment surface (245) to receive a top end (281f) of the surrounding wall (281). According to the fourteenth aspect, connection between the holding unit (25C; 25D) and the accommodation unit (24C) is stabilized.

An interconnection device according to a fifteenth aspect would be realized in combination with any one of the seventh to fourteenth aspects. In the fifteenth aspect, the holding unit (25D) includes a fixed plate (29D) which is made of metal and is fixed to the attachment plate (280). The fixed plate (29D) includes one or more screws holes (290b) for coupling the device (50) thereto. According to the fifteenth aspect, the holding unit (25D) can be attached to the device (50) more firmly.

An interconnection device (10; 10A; 10C) according to a sixteenth aspect would be realized in combination with any one of the first to fifteenth aspects. In the sixteenth aspect, the duct connector (21) is physically attached to the wiring duct (40) at at least two parts thereof. According to the sixteenth aspect, the interconnection device (10; 10A; 10C) can be attached to the wiring duct (40) more strongly, and thus the device (50) can be attached even if it is heavier.

An interconnection device (10; 10A; 10B; 10C; 10E) according to a seventeenth aspect would be realized in combination with any one of the first to sixteenth aspects. In the seventeenth aspect, the duct connector (21; 21B) includes first and second terminals (214a, 214b) electrically connectable to first and second conductors (41a, 41b) of the wiring duct (40) respectively. The housing (20; 20A; 20B; 20C; 20E) includes a rib (240; 240B). The rib (240; 240B) is in contact with a top end of a protrusion (44) protruding from a case (42) of the wiring duct (40) to prevent improper connection in which the first and second terminals (214a, 214b) are electrically connected to the second and first conductors (41b, 41a) respectively. According to the seventeenth aspect, it may be possible to reduce probability that the interconnection device (10; 10A; 10B; 10C; 10E) is attached to the wiring duct (40) in a wrong way.

An interconnection device (10B; 10E) according to an eighteenth aspect would be realized in combination with the seventeenth aspect. In the eighteenth aspect, the rib (240B) is in contact with not the top end of the protrusion (44) but the case (42) in a case of proper connection in which the first and second terminals (214a, 214b) are electrically connected to the first and second conductors (41a, 41b) respectively. According to the eighteenth aspect, the rib (240B) can be used as a guide for attachment of the interconnection device (10B) to the wiring duct (40), and this can facilitate attachment of the interconnection device (10B) to the wiring duct (40).

A device system according to a nineteenth aspect includes: the interconnection device (10; 10A; 10B; 10C; 10E) according to any one of the first to eighteenth aspects; the wiring duct (40); and the device (50). Accordingly, the nineteenth aspect enables communication and power supply to a device (50) by use of a wiring duct (40) even if the device (50) uses a different power standard from the wiring duct (40).

A housing (20C; 20E) for an interconnection device (10C; 10E), according to a twentieth aspect includes an accommodation unit (24C; 24E) and a holding unit (25C; 25D; 25E). The accommodation unit (24C; 24E) includes a duct connector (21; 21B) physically attachable and electrically connectable to a wiring duct (40). The holding unit (25C; 25D; 25E) is configured to physically hold the device (50). The holding unit (25C; 25D; 25E) is a separate unit from the accommodation unit (24C; 24E) and is physically attached to the accommodation unit (24C; 24E). The holding unit (25C; 25D; 25E) includes an attachment plate (280; 250) to which the device (50) is attachable, and a surrounding wall (281; 251). The surrounding wall (281; 251) protrudes from an edge of the attachment plate (280; 250) toward the accommodation unit (24C; 24E) to surround the attachment plate (280; 250). The accommodation unit (24C; 24E) includes an attachment surface (245; 248). The holding unit (25C; 25D; 25E) is physically attached to the attachment surface (245; 248) to allow the attachment plate (280; 250) to face the attachment surface (245; 248).

A housing (20C) for an interconnection device (10C), according to a twenty-first aspect would be realized in combination with the twentieth aspect. In the twenty-first aspect, the housing (20C) further includes a device connector (22) connectable to the device (50) through a connection cable (90). The device connector (22) is provided to a different surface (246) of the accommodation unit (24C) from the attachment surface (245). The attachment plate (280) includes a first opening (280a) allowing the connection cable (90) to pass therethrough. The surrounding wall (281) includes a second opening (281e) allowing the connection cable (90) to pass therethrough.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

The invention claimed is:

1. An interconnection device comprising:
 a housing including a duct connector physically attachable and electrically connectable to a wiring duct for transferring first power;
 a first communication unit which is accommodated in the housing, is connectable to the wiring duct through the duct connector, and is configured to perform communication in a power line communication scheme through the wiring duct;
 an output unit which is accommodated in the housing, and includes a second communication unit configured to communicate with a device in a telecommunication standard different from the power line communication scheme and a conversion unit configured to generate second power of a different standard from the first power based on the first power obtained from the wiring duct through the duct connector and supply the second power to the device.

2. The interconnection device according to claim 1, wherein:
 the housing further includes a device connector connectable to the device through a connection cable;
 the second communication unit is configured to communicate with the device through the connection cable connected to the device connector; and
 the conversion unit is configured to supply the second power to the device through the connection cable connected to the device connector.

3. The interconnection device according to claim 1, wherein
 the housing further includes a holding unit configured to physically hold the device.

4. The interconnection device according to claim 3, wherein:
 the housing includes an accommodation unit configured to accommodate the first communication unit and the output unit; and
 the holding unit is a separate unit from the accommodation unit and is physically attached to the accommodation unit.

5. The interconnection device according to claim 4, wherein:
 the holding unit includes
  an attachment plate to which the device is attachable, and
  a surrounding wall protruding from an edge of the attachment plate toward the accommodation unit to surround the attachment plate;
 the accommodation unit includes an attachment surface; the holding unit is physically attached to the attachment surface to allow the attachment plate to face the attachment surface.

6. The interconnection device according to claim 5, wherein:
 the accommodation unit further includes a device connector which is located on an outer surface different from the attachment surface and is connectable to the device through a connection cable;
 the attachment plate includes a first opening allowing the connection cable to pass therethrough; and
 the surrounding wall includes a second opening allowing the connection cable to pass therethrough.

7. The interconnection device according to claim 6, wherein
 the connection cable goes into an inside of the holding unit through the first opening, goes out from the inside of the holding unit to an outside of the holding unit through the second opening, and is connected to the device connector.

8. The interconnection device according to claim 6, wherein
 the device connector and the second opening are on a same side of the housing.

9. The interconnection device according to claim 8, wherein
 the device connector and the second opening are not aligned in a direction in which the attachment surface of the accommodation unit and the attachment plate of the holding unit face each other.

10. The interconnection device according to claim 3, wherein:
 the housing further includes a device connector connectable to the device through a connection cable; and
 the holding unit and the device connector are on a same side of the housing.

11. The interconnection device according to claim 10, wherein
 the second communication unit is configured to communicate with the device through the connection cable connected to the device connector; and
 the conversion unit is configured to supply the second power to the device through the connection cable connected to the device connector.

12. The interconnection device according to claim 5, wherein
 the holding unit is attachable to the accommodation unit in any one of a plurality of locations; and
 any one of the plurality of locations is a location rotated from a remaining one of the plurality of locations around a rotational axis along a direction in which the attachment surface of the accommodation unit and the attachment plate of the holding unit face each other.

13. The interconnection device according to claim 5, wherein
 an outer surrounding surface of the surrounding wall is flush with an outer surrounding surface surrounding the attachment surface of the accommodation unit.

14. The interconnection device according to claim 5, wherein
 the accommodation unit includes a structure which is provided to the attachment surface to receive a top end of the surrounding wall.

15. The interconnection device according to claim 5, wherein:
 the holding unit includes a fixed plate which is made of metal and is fixed to the attachment plate; and the fixed plate includes one or more screws holes for coupling the device thereto.

16. The interconnection device according to claim 1, wherein
the duct connector is physically attached to the wiring duct at at least two parts thereof.

17. The interconnection device according to claim 1, wherein:
the duct connector includes first and second terminals electrically connectable to first and second conductors of the wiring duct respectively; and
the housing includes a rib which is in contact with a top end of a protrusion protruding from a case of the wiring duct to prevent improper connection in which the first and second terminals are electrically connected to the second and first conductors respectively.

18. The interconnection device according to claim 17, wherein
the rib is in contact with not the top end of the protrusion but the case in a case of proper connection in which the first and second terminals are electrically connected to the first and second conductors respectively.

19. A device system comprising:
the interconnection device according to claim 1;
the wiring duct; and
the device.

* * * * *